United States Patent
Ryu

(10) Patent No.: US 11,047,750 B2
(45) Date of Patent: Jun. 29, 2021

(54) SELF-POWERED SENSING OF TENSILE STRAIN USING MULTIFUNCTIONAL MECHANO-LUMINESCENCE-OPTOELECTRONIC COMPOSITES

(71) Applicant: New Mexico Tech University Research Park Corporation, Socorro, NM (US)

(72) Inventor: Donghyeon Ryu, Socorro, NM (US)

(73) Assignee: New Mexico Tech University Research Park Corporation, Socorro, NM (US)

(*) Notice: Subject to any disclaimer, the term of this patent is extended or adjusted under 35 U.S.C. 154(b) by 0 days.

(21) Appl. No.: 16/293,259

(22) Filed: Mar. 5, 2019

(65) Prior Publication Data
US 2019/0301951 A1   Oct. 3, 2019

Related U.S. Application Data

(60) Provisional application No. 62/638,637, filed on Mar. 5, 2018.

(51) Int. Cl.
*G01L 1/24* (2006.01)
*H01L 51/00* (2006.01)
(Continued)

(52) U.S. Cl.
CPC .............. *G01L 1/24* (2013.01); *B64F 5/60* (2017.01); *H01L 41/082* (2013.01); *H01L 41/1132* (2013.01); *H01L 41/193* (2013.01); *H01L 51/0035* (2013.01); *H01L 51/0036* (2013.01); *H01L 51/0037* (2013.01); *H01L 51/0047* (2013.01); *H01L 51/0048* (2013.01); *H01L 51/0094* (2013.01); *H01L 51/5287* (2013.01); *H02N 2/186* (2013.01); *H01L 51/004* (2013.01)

(58) Field of Classification Search
CPC . G01L 1/24; B64F 5/60; H01L 41/082; H01L 41/1132; H01L 41/193; H01L 51/0035; H01L 51/0036; H01L 51/0037; H01L 51/0047; H01L 51/0048; H01L 51/0094; H01L 51/5287; H01L 51/004; H02N 2/186
USPC ............................................. 73/802
See application file for complete search history.

(56) References Cited

U.S. PATENT DOCUMENTS

| | | | |
|---|---|---|---|
| 9,579,410 B2* | 2/2017 | Simmons | A61L 2/10 |
| 2009/0027872 A1* | 1/2009 | Debije | H01L 31/055 362/84 |

(Continued)

FOREIGN PATENT DOCUMENTS

| | | |
|---|---|---|
| EP | 2128571 B1 | 7/2014 |
| WO | WO-2016020152 A1 | 2/2016 |

OTHER PUBLICATIONS

Alamin et al., Corrosion detection using low-frequency RFID technology, Insight, 2012, vol. 54 (2), p. 72-75.

(Continued)

*Primary Examiner* — Max H Noori
(74) *Attorney, Agent, or Firm* — Wilson Sonsini Goodrich & Rosati

(57) ABSTRACT

Disclosed herein is a composition and a method for energy harvesting and the autonomous detection of structural failure. This method can be used to monitor, for example, the structural integrity of unmanned aircraft systems.

18 Claims, 33 Drawing Sheets

Optical images of 5 layer PEDOT:PSS thin film on PDMS pre-strained to ~25% shows buckling of thin film layers.

(51) Int. Cl.
| | |
|---|---|
| H02N 2/18 | (2006.01) |
| H01L 41/08 | (2006.01) |
| H01L 41/113 | (2006.01) |
| H01L 41/193 | (2006.01) |
| H01L 51/52 | (2006.01) |
| B64F 5/60 | (2017.01) |

(56) References Cited

U.S. PATENT DOCUMENTS

2009/0085444 A1 4/2009 Alvarez et al.
2017/0312614 A1* 11/2017 Tran ................... G06K 9/2018
2017/0369776 A1* 12/2017 Luchinger ............ H01L 33/501
2018/0050524 A1* 2/2018 Sun ..................... C09D 129/14

OTHER PUBLICATIONS

Bol et al., Luminescence of nanocrystalline ZnS:Cu2, Journal of Luminescence, 2002, p. 325-334.
Carden et al., Vibration Based Condition Monitoring: A Review, Structural health Monitoring, 2004, vol. 3 (4), p. 355-377.
Chandra et al., Development of mechanoluminescence technique for impact studies, Journal of Luminescence, 2011, vol. 131, p. 1203-1210.
Chandra et al., Microscopic theory of elastico-mechanoluminescent smart materials, 2014, Appl. Phys. Lett, vol. 104, p. 031102-1-031102-5.
Chandra et al., Self-recovery of mechanoluminescence in ZnS:Cu and ZnS:Mn phosphors by trapping of drifting charge carriers, Appl. Phys. Lett, 2013, vol. 103, p. 161113-1-161113-5.
Chandra et al., Strong luminescence induced by elastic deformation of piezoelectric crystals, 2013, Appl. Phys. Lett., vol. 102, p. 241105-241105-4.
Cosseddu et al., Strain Sensitivity and Transport Properties in Organic Field-Effect Transistors, IEEE Electron Device Letters, 2012, vol. 33 (1), p. 113-115.
Dang et al., P3HT:PCBM, Best Seller in Polymer Photovoltaic Research, Advanced Materials, 2011, vol. 23, p. 3597-3602.
Deuschle et al., Finite element implementation of Puck's failure theory for fibre-reinforced composites under three-dimensional stress, Journal of Composite Materials, 2012, vol. 46 (19- 20), p. 2485-2513.
Dong et al., Organic photoresponse materials and devices, Chemical Society Reviews, Issue 5, 2012, p. 1-115.
Farrar et al., An introduction to structural health monitoring, Phil. Trans. R. Soc.A., 2007, vol. 365, p. 303-315.
Fontenot et al., Comparison of the triboluminescent properties for europium tetrakis and ZnS:Mn powders, 2012, Journal of Theoretical and Applied Physics, vol. 6 (15), p. 1-9.
Giurgiutiu et al., Damage Detection in Thin Plates and Aerospace Structures with the Electro-Mechanical Impedance Method, 2005, Structural Health Monitoring, vol. 4 (2), p. 99-118.
Gullapalli et al., Flexible Piezoelectric ZnO-Paper Nanocomposite Strain Sensor, 2010, Nano Small Micro, vol. 6 (15), p. 1641-1646.
Han et al., A crack-based nickel@graphene-wrapped polyurethane sponge ternary hybrid obtained by electrodeposition for highly sensitive wearable strain sensors, 2017, Journal of Materials Chemistry C, p. 1-22.
Holguim et al., Development of 3D Impact Self-Sensing Composites Using Fractomechanoluminescent EuD4TEA, 2017, p. 1-6.
Hollerman et al., Comparison of triboluminescent emission yields for 27 luminescent materials, Optical Materials, 2012, p. 1517-1521.
Hwang et al., Poly(3-hexylthiophene) wrapped carbon nanotube/poly(dimethylsiloxane) composites for use in finger-sensing piezoresistive pressure sensors, Carbon, 2011, p. 106-110.
Jang et al., Influence of Coalescence on the Anisotropic Mechanical and Electrical Properties of Nickel Powder/Polydimethylsiloxane Composites, Materials, 2016, vol. 9, p. 1-12.
Jeong et al., Bright, wind-driven white mechanoluminescence from zinc sulphide microparticles embedded in a polydimethylsiloxane elastomer, Energy Environ. Sci., 2014, vol. 7, 3338-3346.
Jeong et al., Color Manipulation of Mechanoluminescence from Stress-Activated Composite Films, 2013, Adv. Mater., vol. 25, p. 6194-6200.
Jeong et al., Mechanically driven light-generator with high durability, Appl. Phys. Lett., 2013, vol. 102, p. 051110-1-051110-5.
Katunin et al., Damage identification in aircraft composite structures: A case study using various non-destructive testing techniques, 2015, Composite Structures, vol. 127, p. 1-9.
Khan et al., Progressive Failure Analysis of Laminated Composite Structures Based on Puck's Failure Criteria, American Institute of Aeronautics and Astronautics, 2012, p. 1-29.
Knot et al., Development and evaluation of chemoresistive polymer sensors for low concentration detection of volatile organic compounds related to food safety applications, Sens. & Instrumen. Food Qual., 2010, p. 20-34.
Kim et al., New non-contacting torque sensor based on the mechanoluminescence of ZnS:Cu micropaticles, Sensors and Actuators, 2014, vol. 218, p. 125-131.
Kobakhidez et al., Detecting Mechanoluminescence from ZnS:Mn Powder Using a High Speed Camera, IEEE Sensors Journal, 2013, vol. 13 (8), p. 3053-3059.
Krishnan et al., Dynamic characterization of elastico-mechanoluminescence towards structural health monitoring, 2017, Journal of Intelligent Material Systems and Structures, vol. 28 (17), p. 2458-2464.
Laflamme et al., Robust Flexible Capacitive Surface Sensor for Structural Health Monitoring Applications, 2013, Journal of Engineering mechanics, vol. 139, p. 879-885.
Lee et al., Highly sensitive and flexible strain sensors based on patterned ITO nanoparticle channels, 2017, Nanotechnology, vol. 28.
Lee et al., Initial and progressive failure analyses for composite laminates using Puck failure criterion and damage-coupled finite element method, Composite Structures, 2015, p. 406-419.
Li et al., Polymer solar cells, Nature Photonics, 2012, vol. 6, p. 153-161.
Loh et al, Carbon Nanotube Sensing Skins for Spatial Strain and Impact Damage Identification, J Nondestruct Eval, 2009, vol. 28, p. 9-11.
Loh et al., Tailoring Piezoresistive Sensitivity of Multilayer Carbon Nanotube Composite Strain Sensors, Journal of Intelligent Material Systems and Structures, 2008, vol. 19, p. 746-764.
Markmiller et al., Sensor Network Optimization for a Passive Sensing Impact Detection Technique, 2010, Structural Health Monitoring, vol. 9 (1), p. 25-39.
Nakayasu et al., A comparative study of failure criteria in probabilistic fields and stochastic failure envelopes of composite materials, Reliability Engineering and System Safety, 1997, vol. 56, p. 209-220.
O'Connor et al., Wearable organic solar cells with high cyclic bending stability: Materials selection criteria, Solar Energy Materials & Solar Cells, 2016, vol. 144, p. 438-444.
Olawale et al., Progress in triboluminescence-based smart optical sensor system, Journal of Luminescence, 2011, vol. 131, p. 1407-1418.
PCT International Search Report and Written Opinion dated Aug. 28, 2019 for PCT/US19/20803.
Peng et al., Synthesis and photoluminescence of ZnS:Cu nanoparticles, Optical Materials, 2006, p. 313-317.
Pitt et al., Multiple-site and Widespread Fatigue Damage in Aging Aircraft, Engineering Failure Analysis, 1997, vol. 4 (4), p. 237-257.
Pulliam et al., Development of Self-Powered Strain Sensor using Mechano-Luminescent ZnS:Cu and Mechano-Optoelectronic P3HT, Sensors and Smart Structures Technologies for Civil, Mechanical, and Aerospace Systems, 2017, vol. 10168, p. 101680G-1-101680G-15.
Pulliam et al., Multifunctional Mechano-Luminesce-Optoelectronic Composites for Self-Powered Strain Sensing, 2017, ASME, Conference on Smart Materials, Adaptive Structures and Intelligent Systems.

(56) References Cited

OTHER PUBLICATIONS

Rujing et al., Stretchable and highly sensitive graphene-on-polymer strain sensors, Scientific Reports, p. 1-6.
Ryu et al. Fracto-mechanoluminescent light emission of EuD4TEA-PDMS composites subjected to high strain-rate compressiveloading, Smart Materials and Structures, 2017, p. 1-9.
Ryu et al., Corrugated Photoactive Thin Films for Flexible Strain Sensor, Materials, 2018, vol. 11, p. 1-17.
Ryu et al., In situ reduction of gold nanoparticles in PDMS matrices and applications for large strain sensing, Smart Structures and Systems, 2011, vol. 8 (5), p. 471-486.
Ryu et al., Inkjet-printed, flexible, and photoactive thin film strain sensors, Journal of Intelligent Material Systems and Structures, 2014, p. 1-12.
Ryu et al., Mechanoluminescent Composites Towards Autonomous Impact Damage Detection of Aerospace Structures, 2015, Research Gate, p. 1-9.
Ryu et al., Multi-modal sensing using photoactive thin films, Smart Mater. Struct., 2014, p. 1-16.
Ryu et al., Photoactive and self-sensing P3HT-based thin films for strain and corrosion monitoring, 2014, The International Society for Optical Engineering, vol. 9058, p. 90580Z-01-90580Z-12.
Ryu et al., Self-Sensing Photoactive Thin Films for Monitoring Space Structures, ASME, 2012, p. 1-8.
Ryu et al., Strain sensing using photocurrent generated by photoactive P3HT-based nanocomposites, Smart Mater. Struct., 2012, vol. 21, p. 1-9.
Sage et al., Triboluminescent damage sensors, Smart Mater Struct., 1999, vol. 8, p. 504-510.
Salowitz et al., Bio-inspired stretchable network-based intelligent composites, Journal of Composite Materials, 2012, p. 1-9.
Schilinsky et al., Recombination and loss analysis in polythiophene based bulk heterojunction photodetectors, Appl. Phys. Lett., 2002, vol. 81 (20), p. 3885-3887.
Schuecker et al., Fiber Reinforced Laminates: Progressive Damage Modeling Based on Failure Mechanisms, Arch Comp Methods Eng, 2008, vol. 15, p. 163-184.
Sharma et al., Experimental and Theoretical Study of the Mechanoluminescence of ZnS:Mn Nanoparticles, 2015, Journal of Electronic Materials, vol. 44 (10), p. 3312-3321.
Shin et al., Origin of Mechanoluminescence from Cu-Doped ZnS Particles Embedded in an Elastomer Film and Its Application in Flexible Electro-mechanoluminescent Lighting Devices, Applied Materials & Interfaces, 2015, vol. 8, p. 1098-1103.
Sohn et al., Mechanically driven luminescence in a ZnS:Cu-PDMS composite, APL Mater. 2016, vol. 4, p. 106102-1-106102-7.
Someya et al., Conformable, flexible, large-area networks of pressure and thermal sensors with organic transistor active matrixes, PNAS, 2005, vol. 102 (35), p. 12321-12325.
Wang et al., Super-Elastic Graphene Ripples for Flexible Strain Sensors, 2011, ACS Nano, vol. 5 (5), p. 3645-3650.
Xian et al., Flexible strain sensors with high performance based on metallic glass thin film, Appl. Phys. Lett., 2017, vol. 111, p. 121906-1-121906-5.
Xu et al., Direct view of stress distribution in solid by mechanoluminescence, 1999, Appl. Phys. Lett, vol. 74 (17), 2414-2416.
Xu et al., Flexible Piezoelectric PMN-PT Nanowire-Based Nanocomposite and Device, 2013, Nano Letters, vol. 13, p. 2393-2398.
Yasuda et al., Fabrucation of Stretch-Oriented Regioregular Poly(3-Hexylthiophene) film and its Application to Organic Field-Effect Transistors, Journal of Photopolymer Science and Technology, 2009, vol. 22 (6), p. 713-717.
Yi et al., Passive wireless smart-skin sensor using RFID-based folded patch antennas, International Journal of Smart and Nano Materials, 2011, vol. 2 (1), p. 22-30.
Yun et al., Stress sensing performance using mechanoluminescence of SrAl2O4:Eu (SAOE) and SrAl2O4:Eu, Dy (SAOED), Smart Mater. Struct., 2013, p. 1-12.
Zhao et al, Highly Flexible and Conductive Cellulose-Mediated PEDOT:PSS/MWCNT Composite Flims for Supercapacitor Electrodes, Applied Materials & Interfaces, vol. 9, 13213-13222.
Zhou et al., Flexible Piezotronic Strain Sensor, 2008, Nano Letters, vol. 8 (9), p. 3035-3040.
Ryu, Donghyeon and Loh, Kenneth, Characterizing the Self-Sensing Properties of Photoactive P3HT-based Nanocomposites, 2013, DEStech Publications, Inc., pp. 1-10.
Ryu, Donghyeon and Loh, Kenneth, Multi-modal sensing using photoactive thin films, 2014, Smart Materials & Structures, 23, pp. 1-16, doi:10.1088/0964-1726/23/8/085011.
Ryu, Donghyeon and Loh, Kenneth, Strain sensing using photocurrent generated by photoactive P3HT-based nanocomposites. 2012, Smart Materials & Structures, 21, pp. 1-9, doi:10.1088/0964-1726/21/6/065016.

* cited by examiner

Mean voltage response for five seconds of strain cycling shows increasing voltage response with increased strain rate Normalized voltage vs. strain with best fit lines used to calculate the gauge factor DCI response during strain loading and unloading.   DCV response during strain loading and unloading.

Flexible sensor submerged in liquid PDMS          Fully fabricated flexible sensor encased in PDMS Flexible self-powered sensor response during cyclic strain at 5% and frequency sweep

SELF-POWERED SENSING OF TENSILE STRAIN USING MULTIFUNCTIONAL MECHANO-LUMINESCENCE-OPTOELECTRONIC COMPOSITES

CROSS REFERENCE

This application claims the benefit of U.S. Provisional Application No. 62/638,637, filed Mar. 5, 2018, which is incorporated herein by reference in its entirety.

GOVERNMENT RIGHTS

The present disclosure was made with the support of the United States government under NASA's Established Program to Stimulate Competitive Research. The government has certain rights to the invention.

BACKGROUND

Parts of aeronautical and space structures, such as unmanned aircraft systems and reusable spacecraft, are composed of fiber-reinforced polymer (FRP) composites. Delamination is a mode of failure of composite materials characterized by the separation of material layers. Mechanical parts composed of FRP composites have a high risk of structural systems failure due to the separation of material layers (known as delamination) promoted by harsh operating conditions. Catastrophic structural failures remain a risk for aerospace structural systems.

SUMMARY OF THE INVENTION

In an aspect, the present disclosure provides a structure comprising a) a first layer, wherein the first layer is fiber-reinforced polymer, b) a second layer, wherein the second layer is fiber-reinforced polymer, and c) a mechano-luminescence-optoelectronic composite layer; wherein i) the mechano-luminescence-optoelectronic composite layer is layered between the first layer and the second layer, and is connected to the first layer and the second layer; and ii) the mechano-luminescence-optoelectronic composite produces a direct current in response to a mechanical force that is exerted on the structure.

In some embodiments the structure is a portion of an aerospace structure. In some embodiments, the structure is a portion of a spacecraft. In some embodiments, the structure is a portion of an unmanned aircraft. In some embodiments the mechano-luminescence-optoelectronic composite comprises a) a conductive sheet, wherein the conductive sheet comprises a first face and a second face, b) a mechano-luminescent elastomeric substrate disposed to the first face of the conductive sheet; and c) a mechano-optoelectronic film disposed to the second face of the conductive sheet. In some embodiments the mechano-luminescent elastomeric substrate is a ZnS:Cu/polydimethylsiloxane composite. In some embodiments, the ZnS:Cu/polydimethylsiloxane composite contains about 5% to about 70% ZnS:Cu by mass. In some embodiments, the conductive sheet is a poly(3,4-ethylenedioxythiophene):polystyrene sulfonate sheet. In some embodiments, the mechano-optoelectronic film is a poly(3-hexylthiophene) film. In some embodiments, the mechano-optoelectronic film is a poly(3-hexylthiophene):phenyl-C61-butyric acid methyl ester film. In some embodiments, the poly(3-hexylthiophene):phenyl-C61-butyric acid methyl ester film comprises a 1:1 weight ratio of poly(3-hexylthiophene) to phenyl-C61-butyric acid methyl ester. In some embodiment, the poly(3-hexylthiophene) film is doped with carbon nanotubes. In some embodiments, the first layer has a thickness that is about 0.1 mm to about 5 mm, and the second layer has a thickness that is about 0.1 mm to about 5 mm. In some embodiment, the first layer has a thickness that is about 1.5 mm, and the second layer has a thickness that is about 1.5 mm. In some embodiments, the mechano-luminescence-optoelectronic composite has a thickness that is about 0.1 mm to about 5 mm. In some embodiments, the mechano-luminescence-optoelectronic composite has a thickness that is about 3.5 mm. In some embodiments, the mechanical force is a vibrational force.

In another aspect the present disclosure provides a method comprising detecting delamination of the structure of any of the above embodiments based on a measurement of the direct current produced by the structure.

In another aspect the present disclosure provides a method of harvesting energy comprising collecting the direct current electricity produced by the structure of any one of the above embodiments.

In another aspect, the present disclosure provides a method comprising a) depositing a conductive sheet onto a first face of an elastomer, b) depositing a mechano-optoelectronic film onto the conductive sheet, so that the conductive sheet is between the elastomer and the mechano-optoelectronic film, c) connecting a mechano-luminescent elastomeric substrate to a second face of the elastomer, to provide a mechano-luminescence-optoelectronic composite, and d) layering the mechano-luminescence-optoelectronic composite between a first layer and a second layer, wherein the mechano-luminescence-optoelectronic composite is connected to the first layer and the second layer, wherein the first layer is a fiber-reinforced polymer, and the second layer is a fiber-reinforced polymer.

In some embodiments, the mechano-luminescent elastomeric substrate is a ZnS:Cu/polydimethylsiloxane composite. In some embodiments, the ZnS:Cu/polydimethylsiloxane composite contains about 1% to about 70% ZnS:Cu by mass. In some embodiments, the conductive sheet is a poly(3,4-ethylenedioxythiophene):polystyrene sulfonate sheet. In some embodiments, the mechano-optoelectronic film is a poly(3-hexylthiophene) film. In some embodiments, the mechano-optoelectronic film is a poly(3-hexylthiophene):phenyl-C61-butyric acid methyl ester film. In some embodiments, the poly(3-hexylthiophene):phenyl-C61-butyric acid methyl ester film comprises a 1:1 weight ratio of poly(3-hexylthiophene) to phenyl-C61-butyric acid methyl ester. In some embodiments, the poly(3-hexylthiophene) film is doped with carbon nanotubes. In some embodiments, the first layer of the fiber-reinforced polymer and the second layer of the fiber-reinforced polymer are each about 0.1 mm to about 5 mm. In some embodiments, the thickness of the first layer of the fiber-reinforced polymer and the second layer of the fiber-reinforced polymer are each about 1.5 mm. In some embodiments, the thickness of the mechano-luminescence-optoelectronic composite is about 0.1 mm to about 5 mm. In some embodiments, the thickness of the mechano-luminescence-optoelectronic composite is about 3.5 mm. In some embodiments, the elastomer is pre-strained to about 1% to about 20%. In some embodiments, the elastomer is a polydimethylsiloxane elastomer.

In another aspect the present disclosure provides a structure comprising a) a first layer, wherein the first layer is fiber-reinforced polymer, b) a second layer, wherein the second layer is fiber-reinforced polymer, and c) a mechano-luminescence-optoelectronic composite layer, wherein i) the mechano-luminescence-optoelectronic composite layer is layered between the first layer and the second layer, and is connected to the first layer and the second layer, ii) the mechano-luminescence-optoelectronic composite produces a direct current in response to a mechanical force that is exerted on the structure; and iii) the mechano-luminescence-optoelectronic composite comprises 1) a poly(3,4-ethylenedioxythiophene):polystyrene sulfonate sheet, wherein the poly(3,4-ethylenedioxythiophene):polystyrene sulfonate sheet comprises a first face and a second face; 2) a ZnS:Cu/polydimethylsiloxane composite that contains about 70% ZnS:Cu by weight and is disposed to the first face of the poly(3,4-ethylenedioxythiophene):polystyrene sulfonate sheet; and 3) a poly(3-hexylthiophene):phenyl-C61-butyric acid methyl ester film disposed to the second face of the poly(3,4-ethylenedioxythiophene) polystyrene sulfonate sheet, wherein the structure is a portion of an unmanned aircraft.

In another aspect the present disclosure provides a method of producing an autonomous structural composite, the method comprising a) depositing a poly(3,4-ethylenedioxythiophene):polystyrene sulfonate sheet onto a first face of a polydimethylsiloxane elastomer that is pre-strained to about 20 to about 25%, b) depositing a poly(3-hexylthiophene):phenyl-C61-butyric acid methyl ester film onto the poly(3,4-ethylenedioxythiophene):polystyrene sulfonate sheet so that the poly(3,4-ethylenedioxythiophene):polystyrene sulfonate sheet is between the poly(3-hexylthiophene):phenyl-C61-butyric acid methyl ester film and the polydimethylsiloxane elastomer, c) connecting a ZnS:Cu/polydimethylsiloxane composite that contains about 70% ZnS:Cu by weight to a second face of the elastomer to form a mechano-luminescence-optoelectronic composite; and d) layering the mechano-luminescence-optoelectronic composite between a first layer and a second layer, wherein the mechano-luminescence-optoelectronic composite is connected to the first layer and the second layer, wherein the first layer is a fiber-reinforced polymer, and the second layer is a fiber-reinforced polymer.

INCORPORATION BY REFERENCE

Each patent, publication, and non-patent literature cited in the application is hereby incorporated by reference in its entirety as if each was incorporated by reference individually.

BRIEF DESCRIPTION OF THE FIGURES

FIG. 3 PANEL B shows that light absorption increases as the applied tensile strain increases.

FIG. 5 PANEL B shows dislocations resulting from the application of elastic and/or plastic deformations on a crystal lattice. FIG. 5 PANEL C shows electrons trapped in defects being transferred to the conduction band through the electrostatic potential gradient. FIG. 5 PANEL D illustrates the transfer of trapped electrons from the conduction band to the valence band.

FIG. 9 PANEL B shows that light intensity is affected by tensile strength and strain rate. FIG. 9 PANEL C shows that the color of EML light varies with loading frequency.

FIG. 14 (right panel) shows a graph of the normalized voltage response of a P3HT-based self-sensing thin film under ML light emission versus strain, as well as lines of best fit for each frequency tested.

Hz frequencies (left panels), and fast Fourier transforms of graphs into the frequency domain (right panels).

Figure 24:
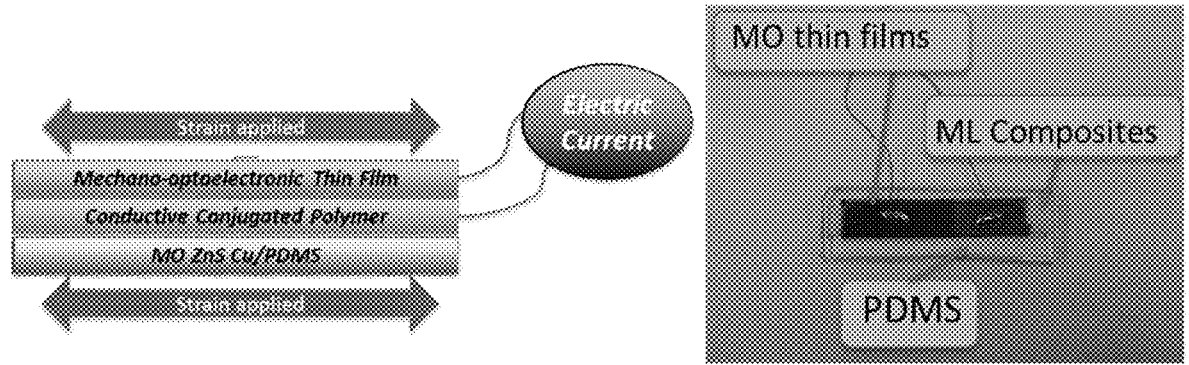

FIG. 24 shows a schematic and an image of an integrated MLO composite encased in PDMS.

Figure 25:
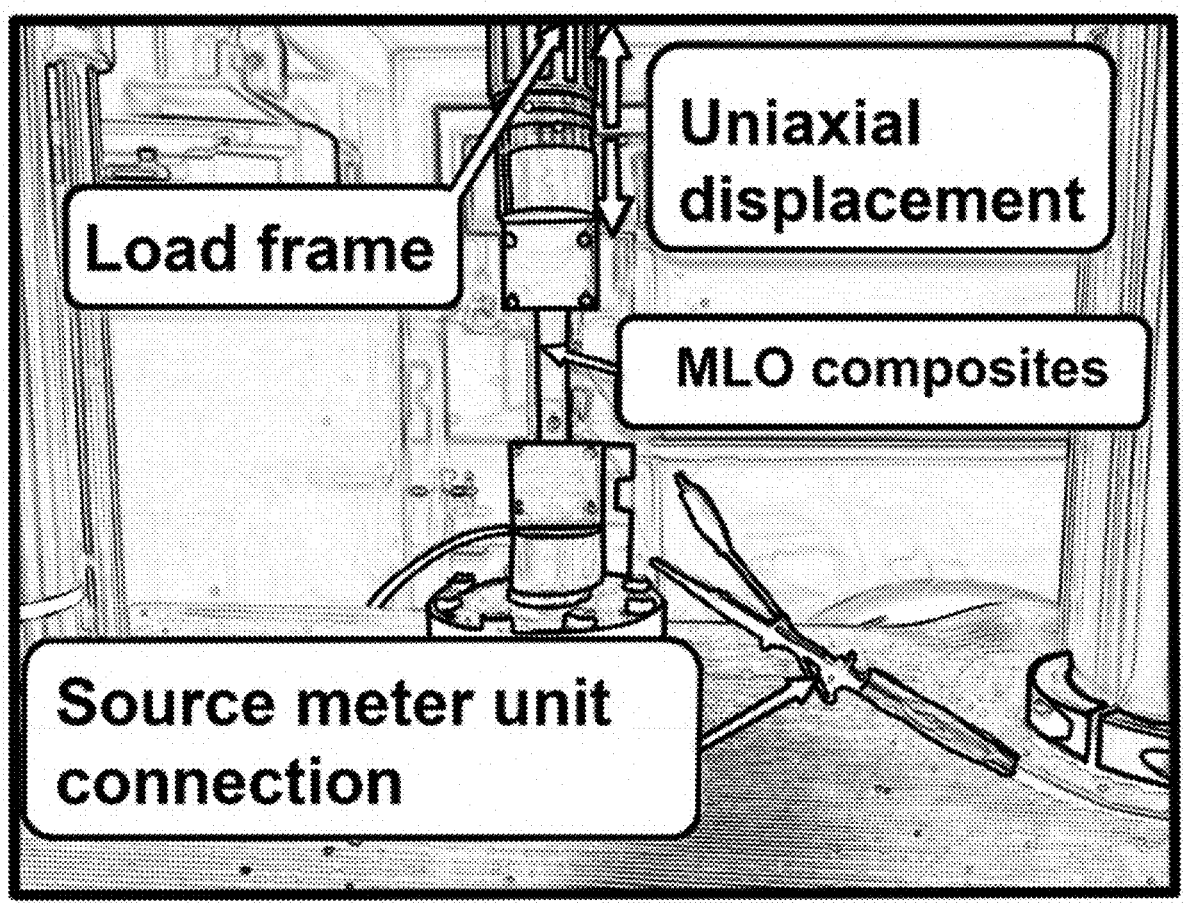

FIG. 25 shows an image of an MTS load frame test setup.

Figure 26:
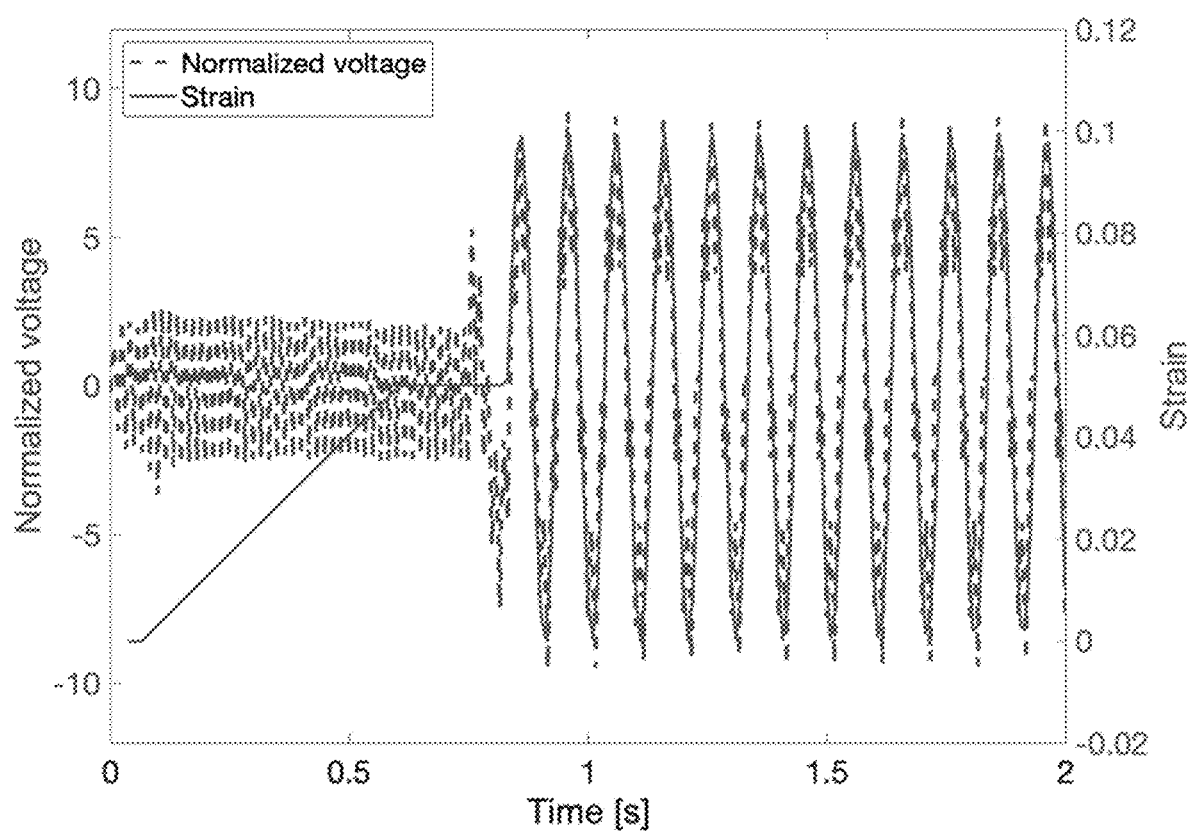

FIG. 26 shows the voltage response of PDMS encased MLO composites at 5 10 Hz frequency with 10% strain.

Figure 27:
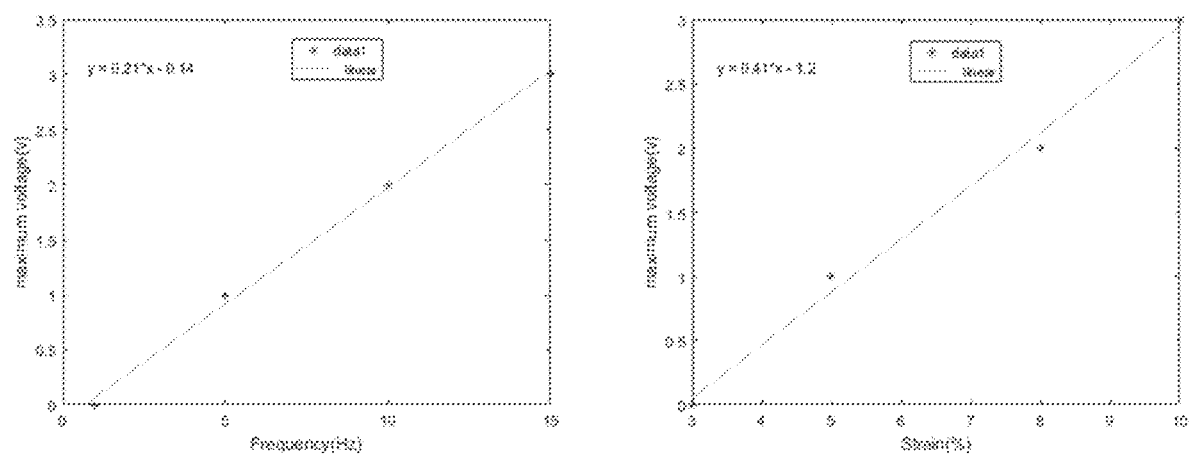

FIG. 27 shows the maximum voltage change of PDMS-encased MLO composites versus frequency (left) or strain (right).

Figure 28:
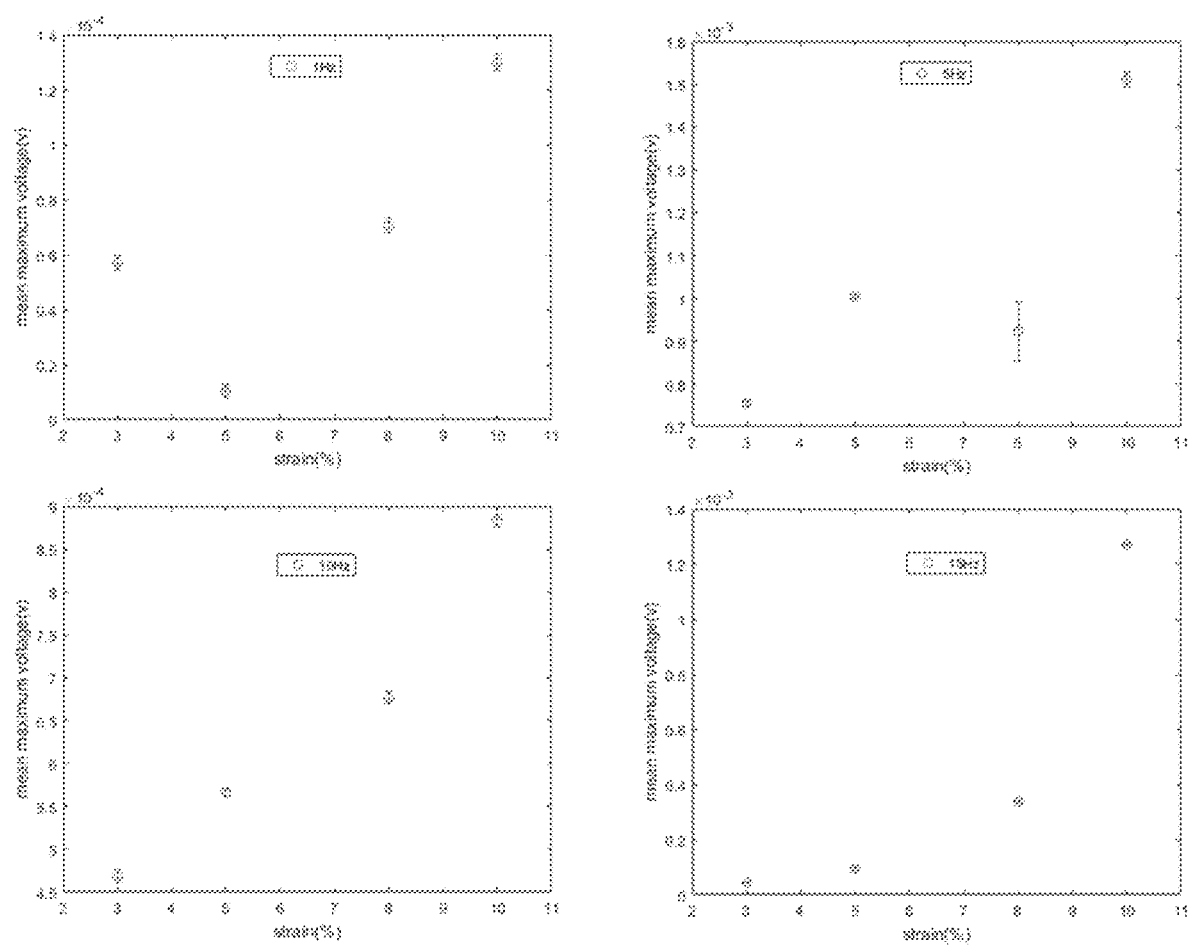

FIG. 28 shows the mean voltage value and standard error of the mean calculated for MLO composites loaded at different strains and frequencies.

Figure 29:
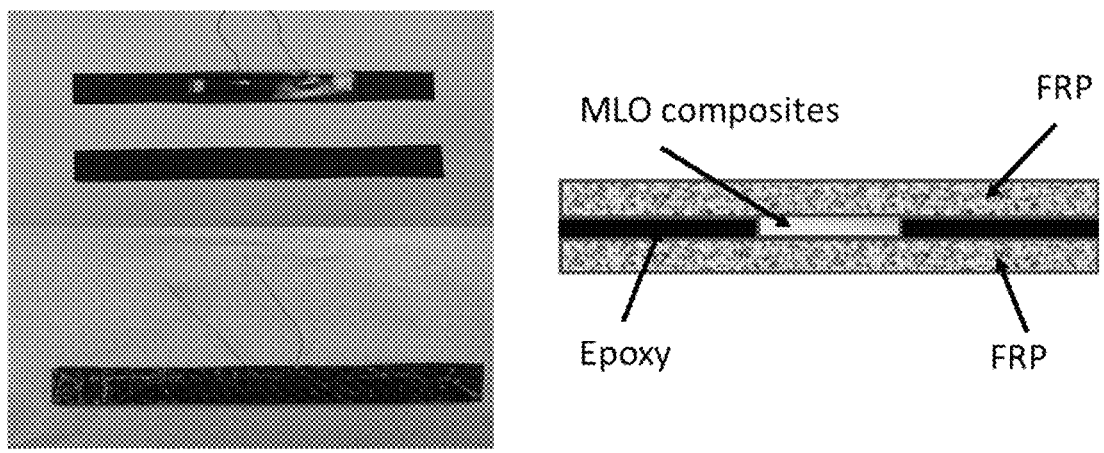
Figure 30:
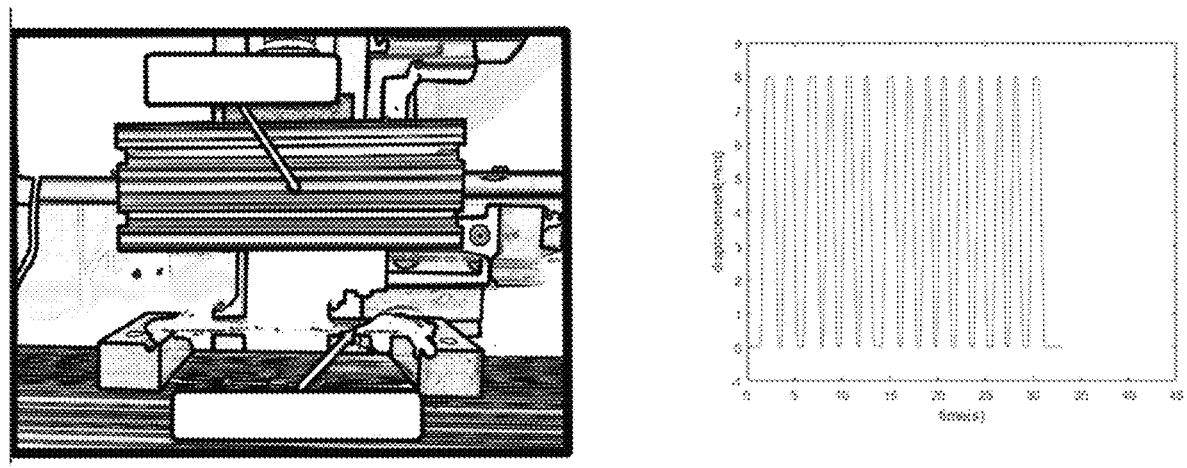

FIG. 29 shows an image and schematic of an autonomous structural composites (AutoCom) sample FIG. 30 shows an image of the four point bending test-setup and a graph of the displacement load pattern used to test produced AutoCom samples.

Figure 31:
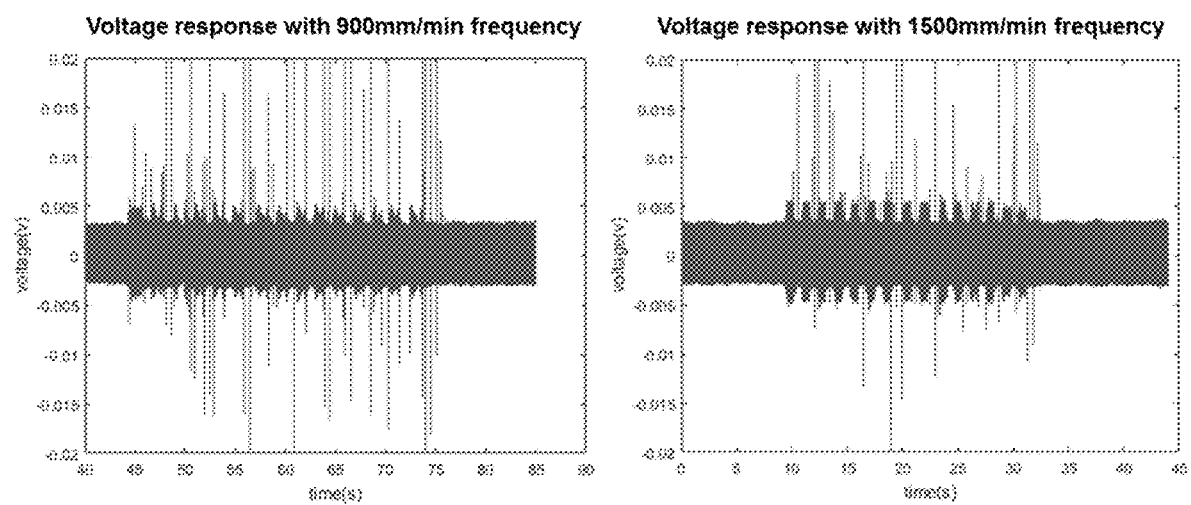

FIG. 31 shows the voltage response of AutoCom samples tested with 900 mm/min (left) and 1500 mm/min (right) frequency.

Figure 32:
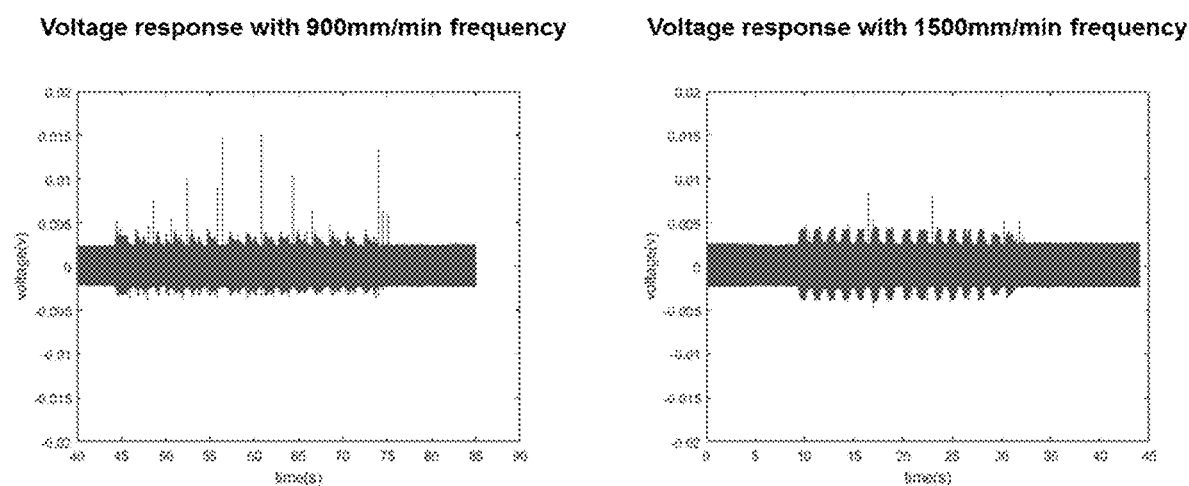

FIG. 32 shows graphs that are the result of filtering the data shown in FIG. 31 to eliminate noise.

Figure 33:
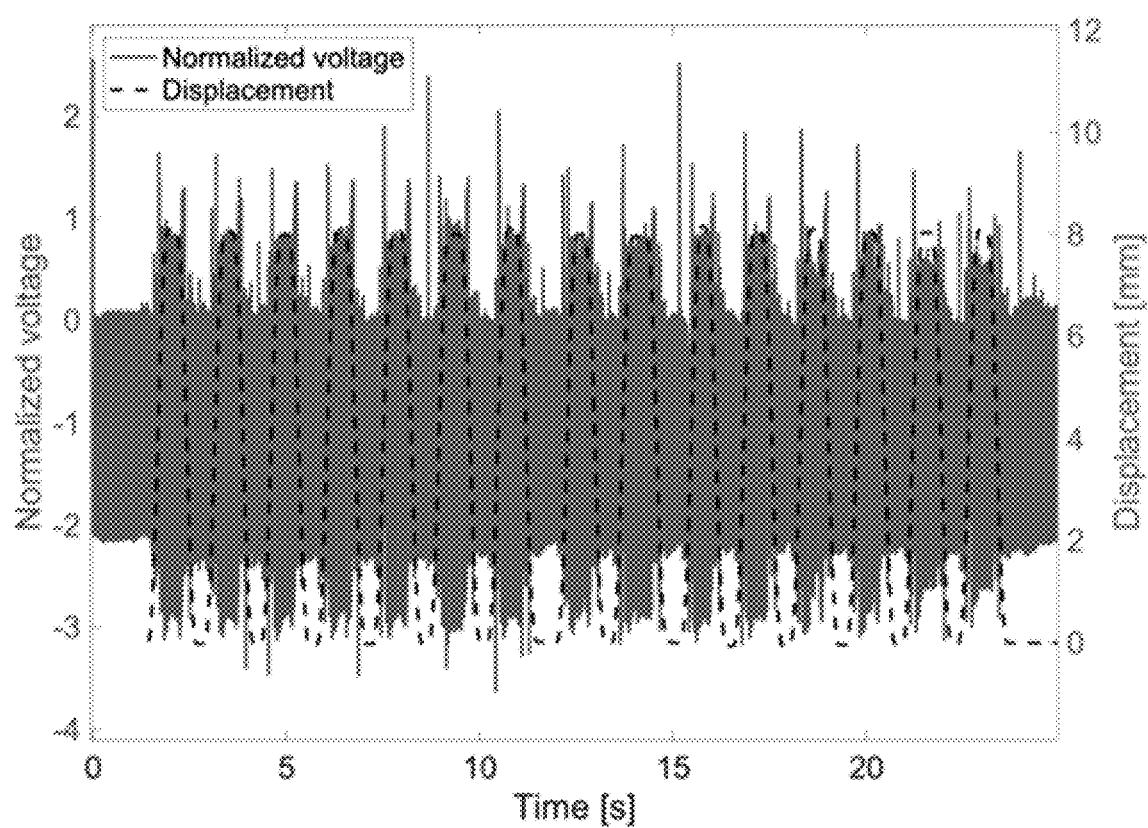

FIG. 33 shows a graph depicting the change of voltage intensity produced by AutoCom materials with strain tested at 1500 mm/min.

DETAILED DESCRIPTION

Figure 1:
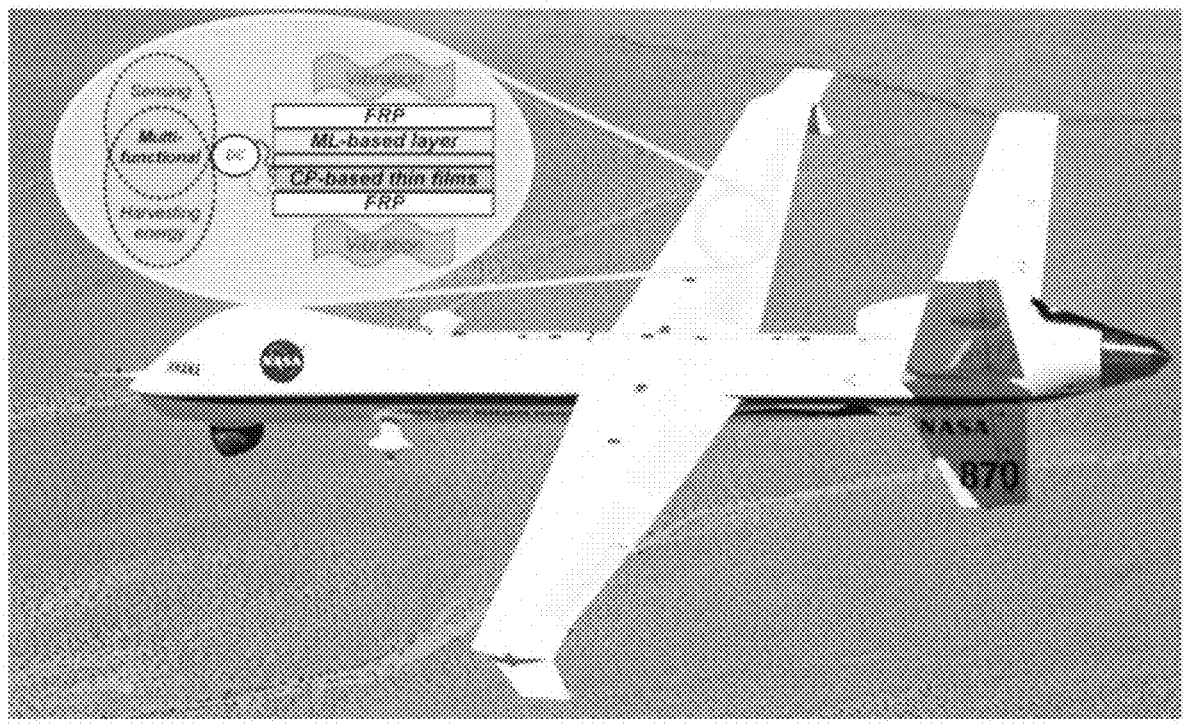
FIG. 1 shows a safe, resilient, and sustainable un-manned aircraft system capable of autonomous damage detection and energy harvesting (ML=mechano-luminescent; FRP=fiber reinforced polymer; CP=conductive polymer).

Disclosed herein is a structure and a method that can improve the safety and sustainability of structures or vehicles, including, for example, unmanned aircraft systems (UASs) and reusable aerospace structures by using autonomous structural composites (AutoCom). AutoComs of the disclosure are capable of autonomously detecting internal delamination in FRPs. The disclosure also describes methods of harvesting energy from sources, including, for example, the ambient vibration of a vehicle such as a UAS. In some embodiments, an AutoCom of the disclosure can autonomously detect damage to UASs and reusable aerospace structural systems with minimum payload and energy consumption. In some embodiments, an AutoCom of the disclosure can prolong the endurance of a UAS or reusable aerospace structure using a self-powered system. FIG. 1 shows a safe, resilient, and sustainable un-manned aircraft system capable of autonomous damage detection and energy harvesting.

Fiber Reinforced Polymers

FRPs are composite materials made up of a polymer matrix that is reinforced with fibers. Non-limiting examples of fibers that can make up FRPs disclosed herein include, for example, glass, carbon, aramid, basalt, paper, wood, and asbestos. The polymer portion of FRPs disclosed herein can be made up of, for example, an epoxy, vinylester, polyester thermosetting plastic, or a phenol formaldehyde resin. FRPs can be produced through several different processes. Non-limiting examples of processes that can be used to produce FRPs include bladder molding, compression molding, mandrel wrapping, wet layup forming, filament winding, pultrusion, resin transfer molding, and the autoclave and vacuum bag method.

To produce FRPs with the autoclave and vacuum bag method, individual sheets of prepeg material are laid-up and placed in an open mold. Prepeg material is comprised of fiber that contains a measured amount of resin. The sheets of prepeg are cover with release film, breather material, and vacuum bag. The entire mold is placed in an autoclave as a vacuum is pulled. This leads to the curing process occurring while a continuous vacuum is present to extract entrapped gasses from the produced laminate. The long, slow cure cycle of this process allows precise control over molding which can ensure the strength of materials. The ensured strength of FRPs produced with the autoclave and vacuum method makes the autoclave and vacuum method useful for applications in, for example, the aerospace industry.

Structural Health Monitoring

Parts of aeronautical and space structures, such as UASs and reusable spacecraft, are composed of FRP composites. Mechanical parts composed of FRP composites have a high risk of structural systems failure due to delamination formation and propagation promoted by harsh operating conditions (e.g., impact and vibrational loads). Non-limiting examples of incidents involving structural systems failure in aircraft, civil infrastructure, naval vessels, and other structural systems include the impact and destruction of the French military satellite Cerise, the antenna penetration on the Hubble Space Telescope, the explosion of Shuttle Orbiter Columbia, and the fatigue crack failure of Aloha Airlines flight 243.

Structural health monitoring (SHM) can reduce the risk of catastrophic structural failures of structural systems, including, for example, aerospace structural systems. Sensors such as accelerometers, fiber optics, Bragg gratings, wireless sensors, and piezoresistive smart materials can be used, but sensors such as these are limited by high energy demands, large form factors, and indirect damage detection. Most sensing systems require a constant power supply or batteries for continuous operation.

The present disclosure describes, for example: 1) the design, development, and manufacturing of multifunctional materials and composites; 2) multiscale analysis of nanocomposites; 3) development of AutoComs; and 4) robust sensor technologies for use in environments including, for example, space. A sensing system and method disclosed herein can provide and/or use SHM technologies to perform autonomous damage detection with minimum payload and without additional energy consumption. The present disclosure also describes multiphysics characterizations to understand properties of interrelated materials. In some embodiments, an advanced sensor and energy harvesting technology is immune to the effects of harsh operating and environmental conditions.

Mechano-Optoelectronic Poly(3-Hexylthiophene)

Figure 2:
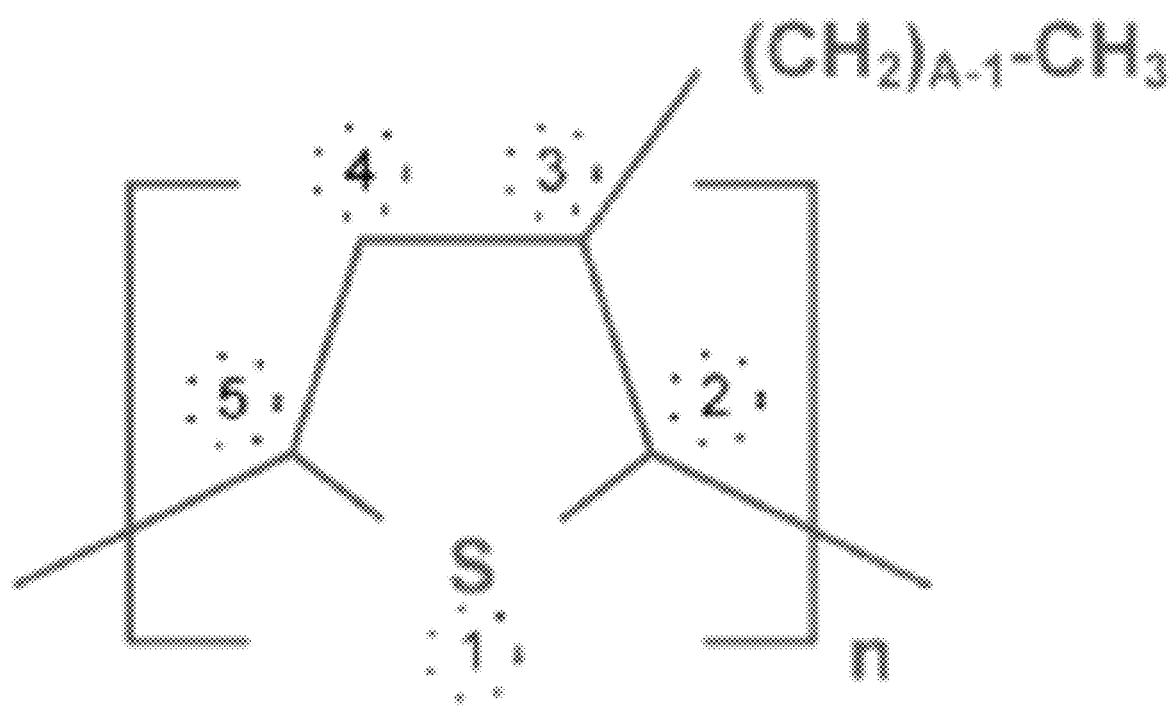
FIG. 2 shows the structure of poly(3-hexylthiophene) (P3HT).

In some embodiments, a SHM technology of the disclosure can utilize the properties of materials such as, for example, P3HT. As shown in FIG. 2, P3HT is a long chain polymer consisting of thiophene monomers with alkyl functional groups attached at location 3 of the thiophene ring. P3HT exhibits unique optoelectronic properties due to electrons being transferred along the backbone of the long chain polymer (i.e., intramolecular electron transfer) and between neighboring molecules (i.e., intermolecular electron transfer).

P3HT can act as an electron donor (i.e., p-type semiconductor). The movement of electrons across P3HT is attributed to the existence of loosely bound electrons (i.e., delocalized electrons) in the sp2 orbital of the thiophene ring. The electron donating ability of P3HT and the intrinsic mechanical flexibility of P3HT makes P3HT a promising candidate for use in flexible electronics. In some embodiments, P3HT can be used in applications such as biomedical sensing, renewable energy, field-effect transistors, and SHM sensors. In some embodiments, P3HT can be used in chemoresistive sensors, piezoresistive sensors, electrical sensors, and optoelectronic sensors.

Figure 3:
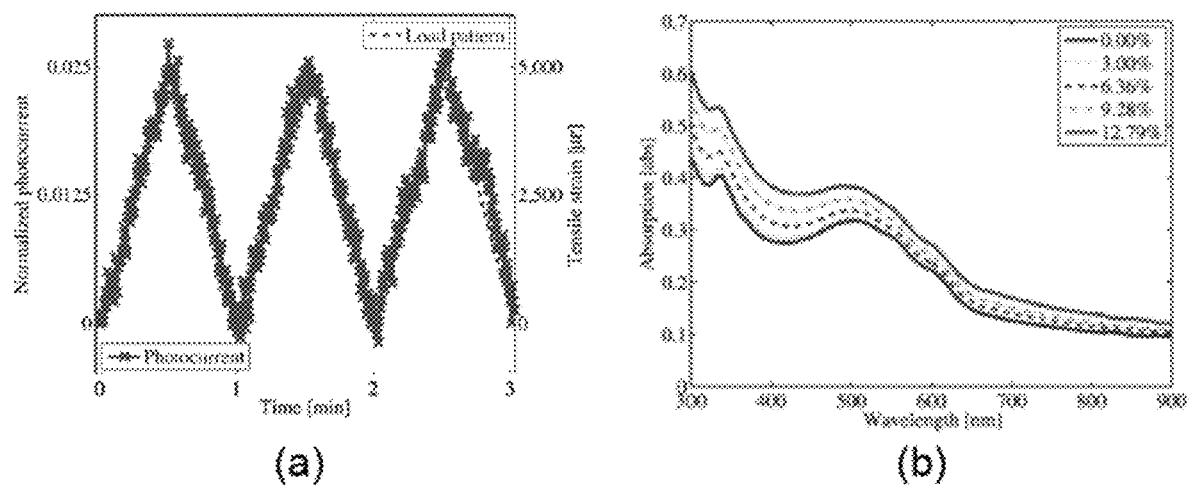
FIG. 3 PANEL A shows a P3HT-based thin film coating exhibiting strain-sensitive direct current changes.

P3HT-based thin films exhibit multifunctional performance capabilities and can possess mechano-optoelectronic (MO) properties. In some embodiments, P3HT-based thin films can be used for self-powered strain sensing. In some embodiments, P3HT-based thin films can be used to harvest energy. In some embodiments, P3HT-based thin films can generate direct current (DC) under light, and the generated DC can vary in magnitude linearly with tensile strain. The strain-sensitive DC generated from a P3HT-based thin film result from: 1) the MO properties of the P3HT-based thin film resulting from P3HT crystalline structures; and 2) optical property changes of the P3HT-based thin film when the film is subjected to macro-scale mechanical deformation (i.e., tensile strain). FIG. 3 PANEL A shows a P3HT-based thin film coating exhibiting strain-sensitive DC current changes. FIG. 3 PANEL B shows that light absorption increases as the applied tensile strain increases, and that light absorption decreases linearly as the applied tensile strain decreases. Variations in light absorption of P3HT-based thin films can modulate the generated DC.

Elastic-Mechano-Luminescent ZnS:Cu

Figure 4:
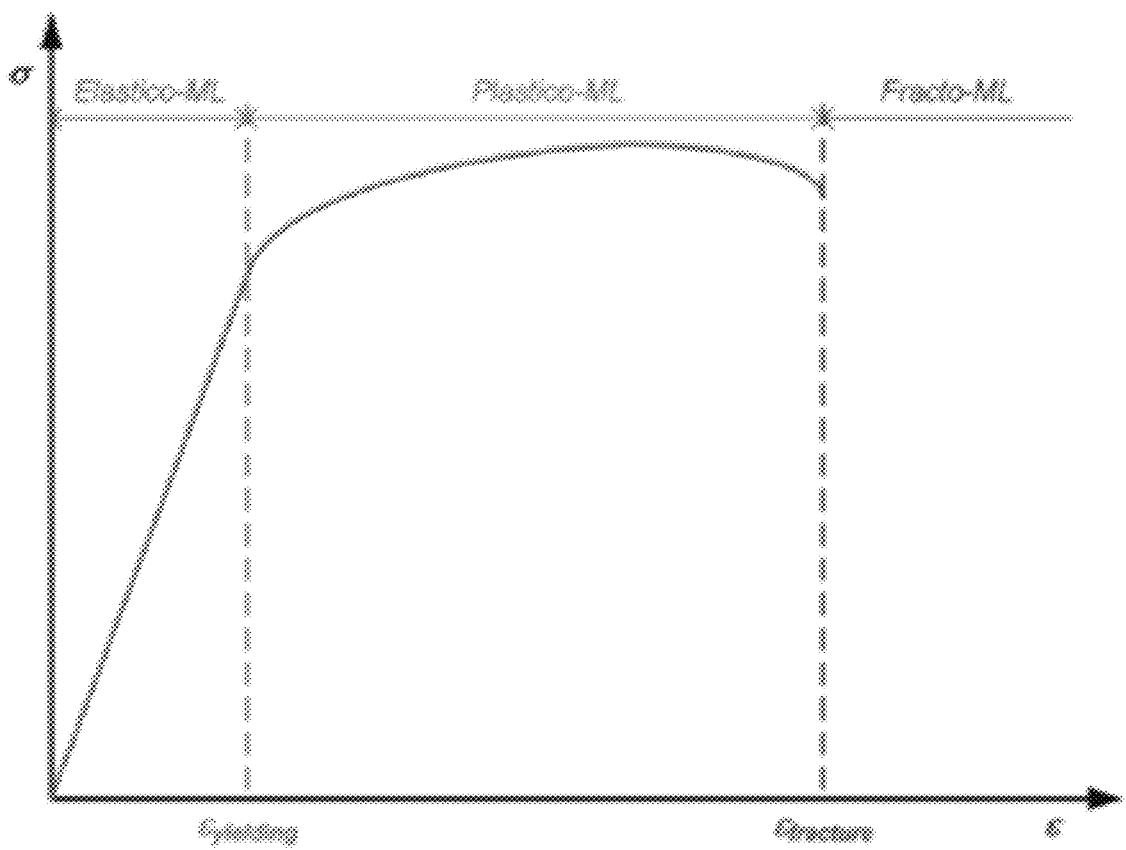
FIG. 4 shows three types of deformation mechano-luminescent materials.

Mechano-luminescence (ML) is a particular type of luminescence, which defines the transformative material property that converts mechanical energy to photonic energy. ML can be classified into two categories: tribo-ML (TML) and deformation-ML (DML). TML exhibits photonic energy emissions due to tribological contacts between two different materials. DML does not involve two different materials in light emission. DML generates light when DML materials are deformed by externally applied mechanical energy. DML generates light regardless of the type of material used to apply mechanical energy. Depending on the extent of deformation at which photonic energy generation is triggered (i.e., threshold deformation for light emission), DML materials are categorized into three different types of DML: fracto-ML, elastic-ML, and plastic-ML. FIG. 4 shows the stress-strain relationship for three types of deformation ML materials.

Unlike fracto-ML (FML) crystals, elastic-ML (EML) crystals are capable of converting mechanical energy to photonic energy without cleavage of the crystalline structures. Among EML materials, wideband gap II-VI semiconducting compounds have high ML yield rates. Zinc sulfide (ZnS) exhibits a particularly high ML yield ratio (i.e., ratio between light intensity and material mass), which is comparable to the ML yield ratio of europium dibenzoylmethide triethylammonium. Europium dibenzoylmethide triethylammonium is a FML crystal that emits a bright amount of light. When ZnS is doped with copper, the Cu-doped ZnS:Cu crystals can exhibit increased capabilities compared to ZnS crystals.

Figure 5:
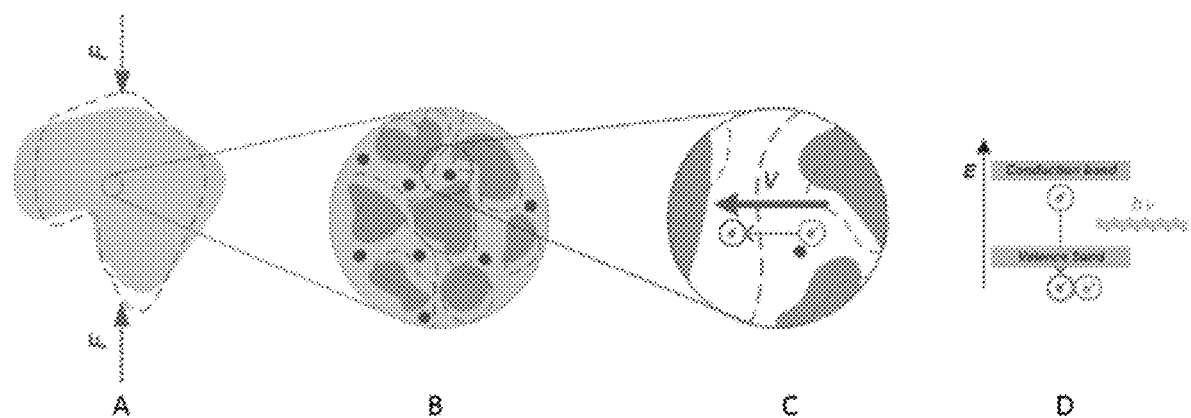
FIG. 5 PANEL A shows the application of elastic and/or plastic deformations on a crystal lattice.

Crystalline lattices are dislocated by elastic and/or plastic deformations, and the dislocations create an electrostatic potential difference between charged dislocations and defects, which are filled with electrons. As the number of dislocations increase, electrons trapped in the defects are transferred to the conduction band through the electrostatic potential gradient attributed to energy band bending by overcoming energy barriers. The transferred electrons are recombined with the holes, resulting in light emission. FIG. 5 PANEL A shows the application of elastic and/or plastic deformations on a crystal lattice. FIG. 5 PANEL B shows dislocations resulting from the application of elastic and/or plastic deformations on a crystal lattice. FIG. 5 PANEL C shows electrons trapped in defects being transferred to the conduction band through the electrostatic potential gradient. FIG. 5 PANEL D illustrates the transfer of trapped electrons from the conduction band to the valence band.

ML light emission profiles including, for example, the intensity and color of ML light, of ZnS:Cu composites can be affected by strain, strain rate, and ZnS:Cu doping concentrations. ML properties of ZnS:Cu composites can be studied under various strain loadings. The ML responses of ZnS:Cu composites resulting from fatigue loading and impact can be measured using, for example, a photoluminescent spectrophotometer, photodiodes, and high-speed camera. In some embodiments, a technology of the disclosure can utilize the ML properties of materials such as, for example, ZnS or ZnS:Cu.

Assembly of MO and ML materials.

In some embodiments, the present disclosure describes the assembly of transformative ML and MO materials. In some embodiments, an assembly of transformative ML and MO materials does not require an external electrical input. In some embodiments, mechanical energy generated from vibrations of structures such as, for example, UAS wings can be harvested. In some embodiments, mechanical energy from vibrations of structures such as, for example, UAS wings can be harvested using mechano-luminescence-optoelectronic (MLO) coupling. MLO composite materials are materials that can produce electric current when exposed to a mechanical force due to the coupling of ML and MO properties. When a mechanical force such as, for example, strain, is applied to a MLO composite material the mechanical force causes luminescence to be released from the ML portion of the material. The released luminescence is absorbed by the MO portion of the material which results in the production of current. In some embodiments, materials are functionalized and designs are optimized to improve the robustness of MLO composite materials. In some embodiments, materials are functionalized and designs are optimized to improve a UAS or reusable aerospace structure's ability to survive harsh operating and environmental conditions.

Development of Multifunctional MLO Composites

Figure 6:
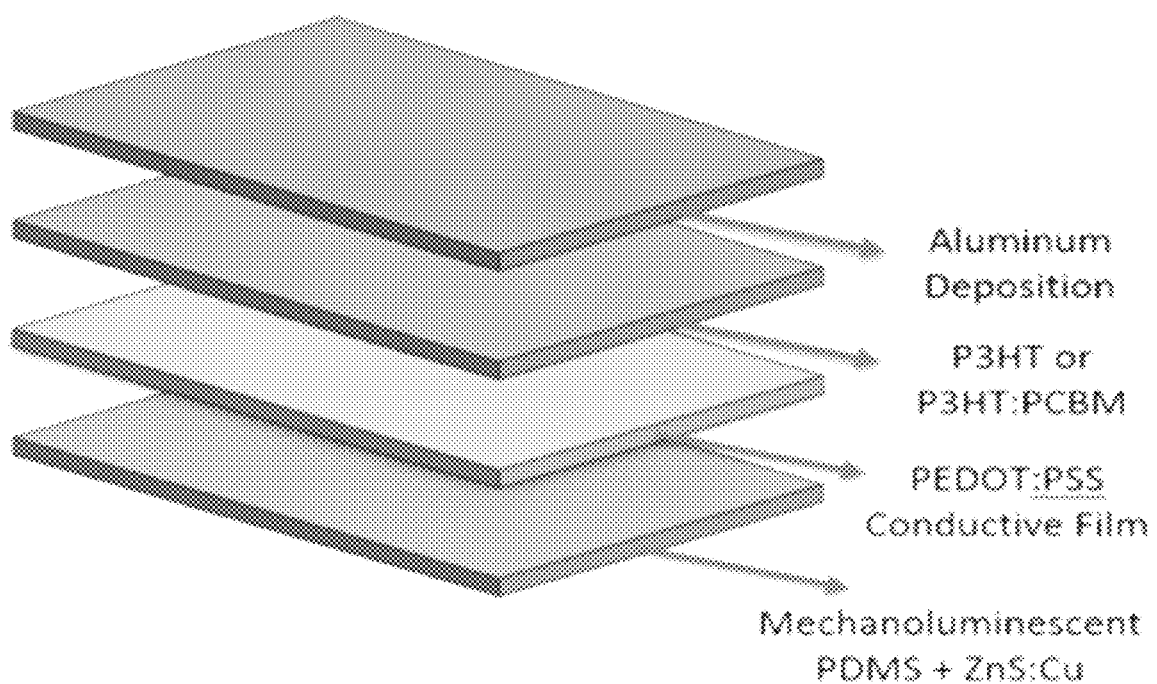
FIG. 6 shows a schematic of an example mechano-luminescence-optoelectronic (MLO) multifunctional composite.

In some aspects, the present disclosure describes the design of a multifunctional MLO composite using two-dimensional building blocks. Two-dimensional building blocks can be, for example: 1) a ML substrate such as, for example, ZnS or ZnS:Cu crystals; and 2) a MO film such as, for example a MO-conjugated P3HT polymer composition. FIG. 6 shows a schematic of an example MLO multifunctional composite. The designed MLO composites can be fabricated by assembling: 1) a ML substrate such as, for example, ZnS:Cu-based elastomeric composites, which emit light in response to mechanical stimuli, with 2) a MO film such as, for example, P3HT-based sensing thin films, which generate DC by absorbing photonic energy (i.e., ML light).

In some embodiments, a conductive sheet, such as, for example a poly(3,4ethylenedioxythiophene):polystyrene sulfonate (PEDOT:PSS) sheet, is between the ML substrate and MO film. In some embodiments one or both of the ML substrate and MO film is in contact with the conductive sheet. In some embodiments one or both of the ML substrate and MO film is attached to the conductive sheet. In some embodiments an air gap or a vacuum is located between the conductive sheet and one or both of the ML substrate and MO film. In some embodiments one or both of the ML substrate and MO film is adjacent to the conducting sheet. In some embodiments one or both of the ML substrate and MO film is not adjacent to the conductive sheet. In some embodiments the ML substrate, MO film and conductive sheet are all held together into a single unit. In some embodiments the ML substrate, MO film, and conductive sheet are held together by compression. In some embodiments the ML substrate, MO film and conductive sheet are encased in a polymer such as, for example PDMS. In some embodiments a transparent or translucent material separates one or both of the ML substrate or MO film from the conductive sheet. In some embodiments different transparent or translucent materials separate the ML substrate and MO film from the conductive sheet.

In some embodiments the ML substrate, MO film and conductive sheet are arranged in layers. The layers can be for example parallel layers, about parallel layers, or deviated from parallel layers. In some embodiments each layer is in contact with at least one other layer. Layers can be separated by, for example, an air gap, a vacuum, a solid, a liquid, or a gas.

In some embodiments, ML ZnS:Cu based elastomeric composites can be produced by dispersing ZnS:Cu powder particles in an elastomer matrix to form a ZnS:Cu/PDMS elastomer. In some embodiments the elastomer matrix is a polydimethylsiloxane (PDMS) elastomer matrix. The amount of ZnS:Cu powder present in composites can be, for example, about 5% (w/w) to about 95% (w/w). The amount of ZnS:Cu powder present in composites can be, for example, about 5% (w/w) to about 10% (w/w), about 5% (w/w) to about 20% (w/w), about 5% (w/w) to about 30% (w/w), about 5% (w/w) to about 40% (w/w), about 5% (w/w) to about 50% (w/w), about 5% (w/w) to about 60% (w/w), about 5% (w/w) to about 70% (w/w), about 5% (w/w) to about 80% (w/w), about 5% (w/w) to about 90% (w/w), about 5% (w/w) to about 95% (w/w), about 10% (w/w) to about 20% (w/w), about 10% (w/w) to about 30% (w/w), about 10% (w/w) to about 40% (w/w), about 10% (w/w) to about 50% (w/w), about 10% (w/w) to about 60% (w/w), about 10% (w/w) to about 70% (w/w), about 10% (w/w) to about 80% (w/w), about 10% (w/w) to about 90% (w/w), about 10% (w/w) to about 95% (w/w), about 20% (w/w) to about 30% (w/w), about 20% (w/w) to about 40% (w/w), about 20% (w/w) to about 50% (w/w), about 20% (w/w) to about 60% (w/w), about 20% (w/w) to about 70% (w/w), about 20% (w/w) to about 80% (w/w), about 20% (w/w) to about 90% (w/w), about 20% (w/w) to about 95% (w/w), about 30% (w/w) to about 40% (w/w), about 30% (w/w) to about 50% (w/w), about 30% (w/w) to about 60% (w/w), about 30% (w/w) to about 70% (w/w), about 30% (w/w) to about 80% (w/w), about 30% (w/w) to about 90% (w/w), about 30% (w/w) to about 95% (w/w), about 40% (w/w) to about 50% (w/w), about 40% (w/w) to about 60% (w/w), about 40% (w/w) to about 70% (w/w), about 40% (w/w) to about 80% (w/w), about 40% (w/w) to about 90% (w/w), about 40% (w/w) to about 95% (w/w), about 50% (w/w) to about 60% (w/w), about 50% (w/w) to about 70% (w/w), about 50% (w/w) to about 80% (w/w), about 50% (w/w) to about 90% (w/w), about 50% (w/w) to about 95% (w/w), about 60% (w/w) to about 70% (w/w), about 60% (w/w) to about 80% (w/w), about 60% (w/w) to about 90% (w/w), about 60% (w/w) to about 95% (w/w), about 70% (w/w) to about 80% (w/w), about 70% (w/w) to about 90% (w/w), about 70% (w/w) to about 95% (w/w), about 80% (w/w) to about 90% (w/w), about 80% (w/w) to about 95% (w/w), or about 90% (w/w) to about 95% (w/w). The amount of ZnS:Cu powder present in composites can be, for example, about 5% (w/w), about 10% (w/w), about 20% (w/w), about 30% (w/w), about 40% (w/w), about 50% (w/w), about 60% (w/w), about 70% (w/w), about 80% (w/w), about 90% (w/w), or about 95% (w/w). The amount of ZnS:Cu powder present in composites can be, for example, at least about 5% (w/w), about 10% (w/w), about 20% (w/w), about 30% (w/w), about 40% (w/w), about 50% (w/w), about 60% (w/w), about 70% (w/w), about 80% (w/w), or about 90% (w/w). The amount of ZnS:Cu powder present in composites can be, for example, at most about 10% (w/w), about 20% (w/w), about 30% (w/w), about 40% (w/w), about 50% (w/w), about 60% (w/w), about 70% (w/w), about 80% (w/w), about 90% (w/w), or about 95% (w/w).

In some embodiments, P3HT-based sensing thin films can be fabricated by doping P3HT with carbon or blending p-type P3HT and n-type phenyl-C61-butyric acid methyl ester (PCBM). The P3HT (with or without carbon nanotube doping) or P3HT:PCBM can be placed between a conductive sheet and a substrate. Non-limiting examples of substrates are, for example, thermally deposited aluminum, glass, elastomers, and PDMS elastomers.

In some embodiments the conductive sheet is made up of 1, 2, 3, 4, 5, 6, 7, 8, 9, or 10 layers of material. In some embodiments the conductive sheet is a PEDOT:PSS sheet. In some embodiments, the conductive sheet is made up of 1, 2, 3, 4, 5, 6, 7, 8, 9, or 10 layers of PEDOT:PSS.

P3HT-based sensing thin films comprising P3HT or P3HT:PCBM in contact with a conductive sheet can be fabricated on, for example, a glass substrate, or a PDMS elastomer. In some embodiments the PDMS elastomer is a ZnS:Cu/PDMS composite. In some instances the PDMS elastomer can be pre-strained. The PDMS elastomer can be pre-strained, for example, to about 1% to about 50%. The PDMS elastomer can be pre-strained, for example, to about 1% to about 5%, about 1% to about 10%, about 1% to about 15%, about 1% to about 20%, about 1% to about 25%, about 1% to about 30%, about 1% to about 35%, about 1% to about 40%, about 1% to about 45%, about 1% to about 50%, about 5% to about 10%, about 5% to about 15%, about 5% to about 20%, about 5% to about 25%, about 5% to about 30%, about 5% to about 35%, about 5% to about 40%, about 5% to about 45%, about 5% to about 50%, about 10% to about 15%, about 10% to about 20%, about 10% to about 25%, about 10% to about 30%, about 10% to about 35%, about 10% to about 40%, about 10% to about 45%, about 10% to about 50%, about 15% to about 20%, about 15% to about 25%, about 15% to about 30%, about 15% to about 35%, about 15% to about 40%, about 15% to about 45%, about 15% to about 50%, about 20% to about 25%, about 20% to about 30%, about 20% to about 35%, about 20% to about 40%, about 20% to about 45%, about 20% to about 50%, about 25% to about 30%, about 25% to about 35%, about 25% to about 40%, about 25% to about 45%, about 25% to about 50%, about 30% to about 35%, about 30% to about 40%, about 30% to about 45%, about 30% to about 50%, about 35% to about 40%, about 35% to about 45%, about 35% to about 50%, about 40% to about 45%, about 40% to about 50%, or about 45% to about 50%. The PDMS elastomer can be pre-strained, for example, to about 1%, about 5%, about 10%, about 15%, about 20%, about 25%, about 30%, about 35%, about 40%, about 45%, or about 50%. The PDMS elastomer can be pre-strained, for example, to at least about 1%, about 5%, about 10%, about 15%, about 20%, about 25%, about 30%, about 35%, about 40%, or about 45%. The PDMS elastomer can be pre-strained, for example, to at most about 5%, about 10%, about 15%, about 20%, about 25%, about 30%, about 35%, about 40%, about 45%, or about 50%.

MLO multifunctional composites can be designed using a bottom-up nanotechnology and factorial design methodology. Target functionalities that the MLO multifunctional composites are required to exhibit can be established. Functional building blocks such as, for example, ZnS:Cu and P3HT used to tune the transformative properties of the functional building blocks for acquiring the target functionalities can be designed. In some embodiments, the transformative properties of the functional building blocks are the ML and MO of the materials. The functional building blocks can be assembled to harness the unique transformative properties at a macro-scale. The transformative MO and ML properties of the two functional building blocks can be coupled to achieve target functionalities.

In some embodiments, P3HT and ZnS:Cu can be used as functional building blocks. To design the functional building blocks to achieve desired luminescent and optoelectronic properties under various types of loadings, the ML properties of ZnS:Cu, and the MO properties of P3HT can be analyzed. The MO property of P3HT is greatly affected by regioregularity and crystallinity of P3HT molecules. The piezo-optical properties of P3HT (FIG. 3 PANEL B) are attributed to the improved crystallinity of P3HT under applied strain.

The effect of mechanical and thermal strain on changes in crystallinity, and the optoelectronic properties of P3HT can be studied using techniques including, for example, X-ray diffraction and an atomic force microscopy (AFM). Grazing incidence (GI) diffraction and small angle X-ray scattering (SAXs) can be used to characterize the 3-dimensional crystalline structure of P3HT.

ZnS:Cu composite and P3HT-based building blocks can be assembled up to a meso-scale using thin film fabrication techniques. P3HT-based sensing films can be fabricated on a conductive sheet with two electrodes. To scale up fabrication of the P3HT-based sensing thin films, techniques including, for example, inkjet printing techniques can be used. ZnS:Cu-based elastomeric composites can be fabricated on the other side of the conductive sheet on which the P3HT-based sensing thin films are deposited, resulting in the fabrication of MLO multifunctional composites. Non-limiting examples conductive sheet on which the P3HT-based sensing films and ZnS:Cu-based elastomeric composites can be fabricated on are, for example, polyimide sheets or PEDOT:PSS sheets.

A MLO composite of the disclosure can exhibit multifunctional capabilities including, for example, self-powered sensing and energy harvesting, by coupling the ML of ZnS:Cu and the MO of P3HT. A strained ZnS:Cu-based functional layer can emit light, which is supplied through a sheet such as, for example, a polyimide or PEDOT:PSS sheet, to the P3HT-based sensing thin film to generate DC. In some embodiments, the magnitude of the generated DC varies with the applied strain; strain-sensitive DC can be used as the sensor signal. Multimodal sensing capabilities can be encoded by dying P3HT-based thin films to tune light absorption wavelengths such that frequency changes can be recorded. The color of ML light from ZnS:Cu can vary with loading frequency. A composite of the disclosure can exhibit energy harvesting capabilities from the generated DC.

In some embodiments, a MLO composite of the disclosure can produce a voltage change in response to strain as low as about 20%, about 15%, about 10%, about 5%, about 4%, about 3%, about 2%, or about 1%. In some embodiments a MLO composite of the disclosure can produce a voltage change in response to a loading frequency as low as about 1 Hz, about 2 Hz, about 3 Hz, about 4 Hz, or about 5 Hz.

Design optimization is performed to attain desired functionalities, such as high strain sensitivity, frequency-sensitive multimodal sensing, and high PCE. After assembly of the two functional building blocks, self-powered and multimodal sensing and energy harvesting can be assessed through experimental and theoretical studies. Computational and experimental studies can be conducted to investigate the effective modulus, hardness, stress-strain characteristics, and damage evolution as influenced by the material and geometric layout. A TriboIndenter® can be used to assess the mechanical resiliency of the MLO composites.

Applications of Multifunctional MLO Composites

MLO multifunctional composites can be integrated with FRPs to produce an AutoCom disclosed herein. In some embodiments a MLO composite is integrated with a FRP by layering the MLO composite between two FRP layers. An MLO composite can be in direct contact with one or both of the FRP layers or additional layers can be between the MLO composite and FRP layers. In some embodiments, a mechanical force such as, for example, a vibrational force that is applied to one or both of the FRP layers is transduced to an MLO composite between the FRP layers. MLO composites can be attached to FRP layers directly or indirectly.

An FRP layer of an AutoCom disclosed herein can have a thickness of about 0.1 mm to about 5 mm. An FRP layer can have a thickness of about 0.1 mm to about 0.5 mm, about 0.1 mm to about 1 mm, about 0.1 mm to about 1.5 mm, about 0.1 mm to about 2 mm, about 0.1 mm to about 2.5 mm, about 0.1 mm to about 3 mm, about 0.1 mm to about 3.5 mm, about 0.1 mm to about 4 mm, about 0.1 mm to about 4.5 mm, about 0.1 mm to about 5 mm, about 0.5 mm to about 1 mm, about 0.5 mm to about 1.5 mm, about 0.5 mm to about 2 mm, about 0.5 mm to about 2.5 mm, about 0.5 mm to about 3 mm, about 0.5 mm to about 3.5 mm, about 0.5 mm to about 4 mm, about 0.5 mm to about 4.5 mm, about 0.5 mm to about 5 mm, about 1 mm to about 1.5 mm, about 1 mm to about 2 mm, about 1 mm to about 2.5 mm, about 1 mm to about 3 mm, about 1 mm to about 3.5 mm, about 1 mm to about 4 mm, about 1 mm to about 4.5 mm, about 1 mm to about 5 mm, about 1.5 mm to about 2 mm, about 1.5 mm to about 2.5 mm, about 1.5 mm to about 3 mm, about 1.5 mm to about 3.5 mm, about 1.5 mm to about 4 mm, about 1.5 mm to about 4.5 mm, about 1.5 mm to about 5 mm, about 2 mm to about 2.5 mm, about 2 mm to about 3 mm, about 2 mm to about 3.5 mm, about 2 mm to about 4 mm, about 2 mm to about 4.5 mm, about 2 mm to about 5 mm, about 2.5 mm to about 3 mm, about 2.5 mm to about 3.5 mm, about 2.5 mm to about 4 mm, about 2.5 mm to about 4.5 mm, about 2.5 mm to about 5 mm, about 3 mm to about 3.5 mm, about 3 mm to about 4 mm, about 3 mm to about 4.5 mm, about 3 mm to about 5 mm, about 3.5 mm to about 4 mm, about 3.5 mm to about 4.5 mm, about 3.5 mm to about 5 mm, about 4 mm to about 4.5 mm, about 4 mm to about 5 mm, or about 4.5 mm to about 5 mm. An FRP layer can have a thickness of about 0.1 mm, about 0.5 mm, about 1 mm, about 1.5 mm, about 2 mm, about 2.5 mm, about 3 mm, about 3.5 mm, about 4 mm, about 4.5 mm, or about 5 mm. An FRP layer can have a thickness of at least about 0.1 mm, about 0.5 mm, about 1 mm, about 1.5 mm, about 2 mm, about 2.5 mm, about 3 mm, about 3.5 mm, about 4 mm, or about 4.5 mm. An FRP layer can have a thickness of at most about 0.5 mm, about 1 mm, about 1.5 mm, about 2 mm, about 2.5 mm, about 3 mm, about 3.5 mm, about 4 mm, about 4.5 mm, or about 5 mm. In some embodiments, the two FRP layers are separated by the thickness of the MLO composite. The thickness of the MLO composite can be about 0.1 mm to about 5 mm. The thickness of the MLO composite can be about 0.1 mm to about 0.5 mm, about 0.1 mm to about 1 mm, about 0.1 mm to about 1.5 mm, about 0.1 mm to about 2 mm, about 0.1 mm to about 2.5 mm, about 0.1 mm to about 3 mm, about 0.1 mm to about 3.5 mm, about 0.1 mm to about 4 mm, about 0.1 mm to about 4.5 mm, about 0.1 mm to about 5 mm, about 0.5 mm to about 1 mm, about 0.5 mm to about 1.5 mm, about 0.5 mm to about 2 mm, about 0.5 mm to about 2.5 mm, about 0.5 mm to about 3 mm, about 0.5 mm to about 3.5 mm, about 0.5 mm to about 4 mm, about 0.5 mm to about 4.5 mm, about 0.5 mm to about 5 mm, about 1 mm to about 1.5 mm, about 1 mm to about 2 mm, about 1 mm to about 2.5 mm, about 1 mm to about 3 mm, about 1 mm to about 3.5 mm, about 1 mm to about 4 mm, about 1 mm to about 4.5 mm, about 1 mm to about 5 mm, about 1.5 mm to about 2 mm, about 1.5 mm to about 2.5 mm, about 1.5 mm to about 3 mm, about 1.5 mm to about 3.5 mm, about 1.5 mm to about 4 mm, about 1.5 mm to about 4.5 mm, about 1.5 mm to about 5 mm, about 2 mm to about 2.5 mm, about 2 mm to about 3 mm, about 2 mm to about 3.5 mm, about 2 mm to about 4 mm, about 2 mm to about 4.5 mm, about 2 mm to about 5 mm, about 2.5 mm to about 3 mm, about 2.5 mm to about 3.5 mm, about 2.5 mm to about 4 mm, about 2.5 mm to about 4.5 mm, about 2.5 mm to about 5 mm, about 3 mm to about 3.5 mm, about 3 mm to about 4 mm, about 3 mm to about 4.5 mm, about 3 mm to about 5 mm, about 3.5 mm to about 4 mm, about 3.5 mm to about 4.5 mm, about 3.5 mm to about 5 mm, about 4 mm to about 4.5 mm, about 4 mm to about 5 mm, or about 4.5 mm to about 5 mm. The thickness of the MLO composite can be about 0.1 mm, about 0.5 mm, about 1 mm, about 1.5 mm, about 2 mm, about 2.5 mm, about 3 mm, about 3.5 mm, about 4 mm, about 4.5 mm, or about 5 mm. The thickness of the MLO composite can be at least about 0.1 mm, about 0.5 mm, about 1 mm, about 1.5 mm, about 2 mm, about 2.5 mm, about 3 mm, about 3.5 mm, about 4 mm, or about 4.5 mm. The thickness of the MLO composite can be at most about 0.5 mm, about 1 mm, about 1.5 mm, about 2 mm, about 2.5 mm, about 3 mm, about 3.5 mm, about 4 mm, about 4.5 mm, or about 5 mm.

An AutoCom of the disclosure can be used in the fabrication of structures. Non-limiting examples of structures that can comprise an AutoCom of the disclosure include airplanes, helicopters, spacecraft, boats, ships, offshore platforms, automobiles, sporting goods, buildings, bridges, tunnels, military vehicles, UASs, and aerospace structures. When incorporated into a structure an AutoCom of the disclosure can perform functions including, for example, autonomous damage detection and mechano-luminescent optoelectronic energy conversion.

Autonomous Damage Detection:

In some embodiments, an AutoCom of the disclosure is developed by embedding MLO multifunctional composites into FRP structural composites. The MLO multifunctional composites do not require an external electrical source due to the uniquely coupled MLO properties that generate DC when the composite is subjected to mechanical strain. MLO multifunctional composites can perform self-powered sensing by utilizing strain sensitive DC. The magnitude of DC can indicate the amount of applied strain. The self-sensing characteristic of the P3HT-based sensing thin film component of the MLO composites can allow direct damage detection with less computational cost. The small form factor of the MLO multifunctional composite can enable the integration of the MLO composites inside of the FRP structural composites with negligible increases in payload.

Mechano-Luminescent-Optoelectronic Energy Conversion:

In some embodiments, an AutoCom of the disclosure is capable of harvesting energy. Energy generated by MLO multifunctional composites embedded within the AutoCom can be used as a supplemental energy source for energy harvesting technologies (e.g., solar panels on wing span) for vehicles or structures such as, for example, UASs, without increasing the payload.

EXAMPLES

Example 1. P3HT-Based Sensor Synthesis and Characterization of Piezo-Optical Properties MO P3HT thin films were fabricated by dissolving P3HT in 1,2-dichlorobenzene (DCB) at 3% w/v. The solution was mixed on a hot plate (45° C., 450 rpm) until completely dissolved and then filtered. The resulting homogenous solution was spin coated (300 rpm for 40 seconds, then 1000 rpm for 60 seconds) on top of a PDMS elastomer substrate, annealed in an oven at 100° C. for 1 hour and then removed from a 10 mm silicon wafer. A "dog bone" shaped sample of the thin film was then cut out for UV-Vis characterization.

Figure 7:
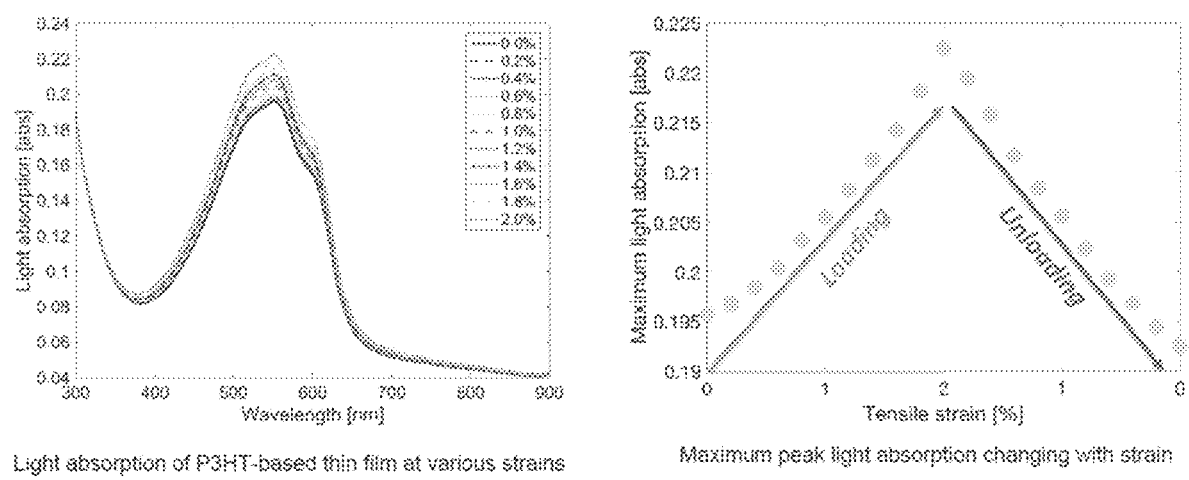
FIG. 7 shows graphs depicting the light absorption of P3HT-based thin films at various strains (left) and the maximum peak light absorption versus strain for P3HT-based thin films (right).

For UV-Vis characterization, the P3HT thin film sample was mounted in a custom tensile loading frame and absorption data was obtained at different strain levels from 0 to 2% at 0.2% increments. Photon absorption was then scanned from 300-900 nm. As can be seen in FIG. 7, the main absorption peak was at ~550 nm. Results showed that strain affected light absorption of P3HT and that there was repeatability in light absorption during cyclical loading and unloading.

Figure 8:
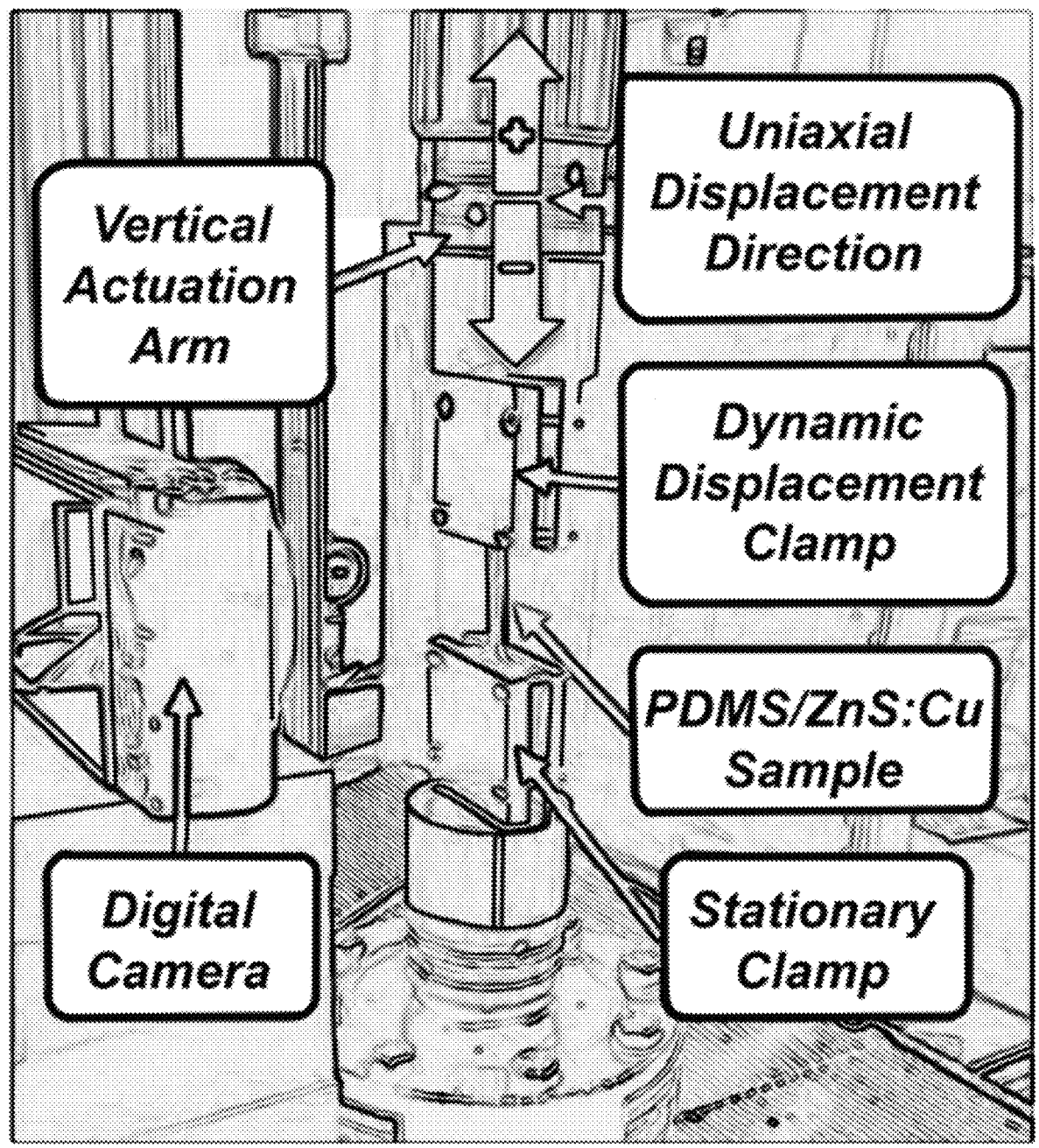
FIG. 8 shows the MTS testing machine used to test the response of ZnS:Cu composites to cyclical strain loading.
Figure 9:
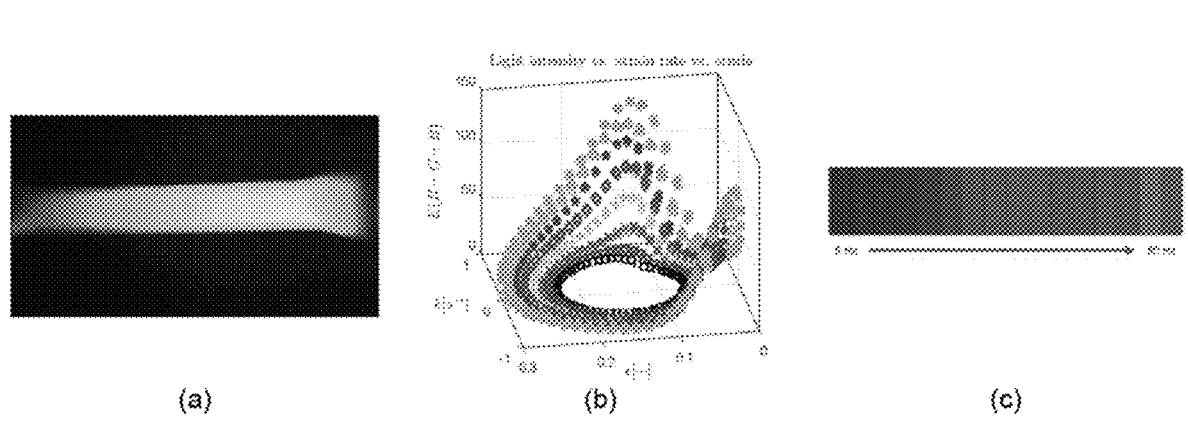
FIG. 9 PANEL A shows a photograph of elastic mechano-luminescent (EML) light emissions of a ZnS:Cu-based elastomeric composite material.

Example 2. Design and Testing of EML Light Emission of ZnS:Cu Samples Under Tensile Strain EML light emission of ZnS:Cu samples were characterized under cyclic tensile strain loadings and unloadings. ZnS:Cu powder particles were uniformly dispersed in a PDMS elastomer matrix and annealed via heating in an oven to fabricate ZnS:Cu-based elastomeric composites. Composites were used to produce two types of ML ZnS:Cu test samples. Dog bone cut outs of composites were used to study light emission of samples during cyclic strain loading, while samples formed on glass slides were used for fabricating MLO composite sensors. To test the response of ZnS:Cu composites to cyclical strain loading, composites were subjected to cyclic loadings that applied strains of up to 30%, with loading frequencies ranging from 1 Hz to 80 Hz. Tests were performed in a darkened room using a MTS testing machine set up as shown in FIG. 8. Light was captured with a digital camera. Light intensity and the color of EML light emissions from ZnS:Cu/PDMS composites were affected by the amount of strain applied and the strain rate. FIG. 9 PANEL A shows a photograph of EML light emissions of a ZnS:Cu-based elastomeric composite material. FIG. 9 PANEL B shows that light intensity is affected by tensile strength and strain rate. FIG. 9 PANEL C shows that the color of EML light varies with loading frequency.

Example 3. Design and Testing of First Generation MLO Composites

Figure 10:
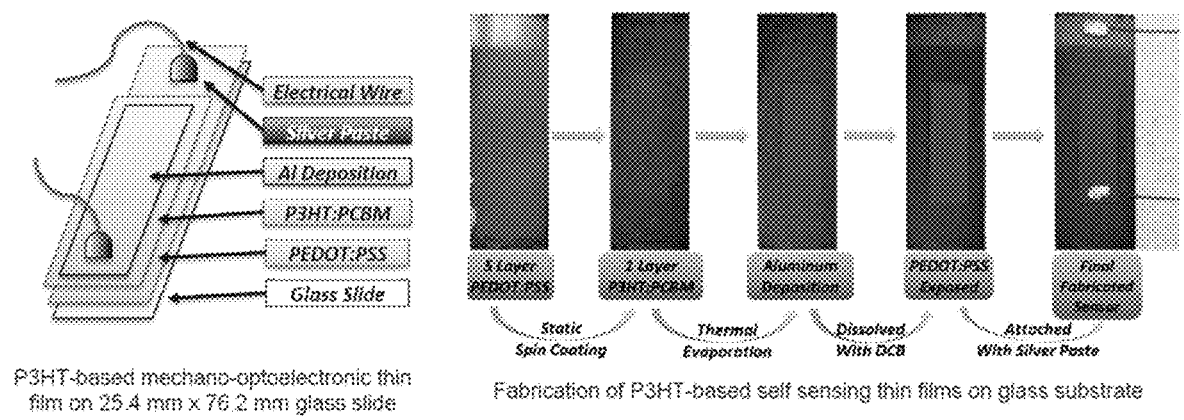
FIG. 10 shows a schematic and images of the assembly process of a P3HT-based self-sensing thin film fabricated on a glass substrate.

To generate MLO composites, MO P3HT-based self-sensing thin films were fabricated by blending p-type P3HT and n-type PCBM. The P3HT:PCBM blend was sandwiched between one or more layers of PEDOT:PSS and thermally deposited aluminum. P3HT-based self-sensing thin films were fabricated on a glass substrate, and first generation MLO composites were built by coupling with ML ZnS:Cu-based composites. A schematic and image of an example of this assembly is shown in FIG. 10.

Figure 11:
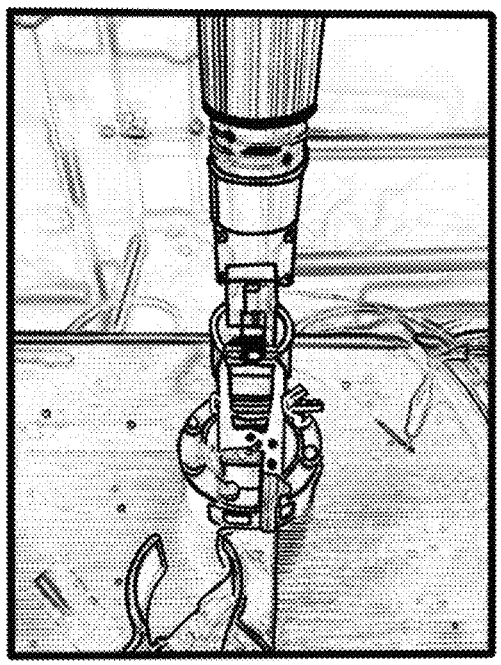
FIG. 11 shows the test setup used to validate direct current voltage (DCV) generation by P3HT think film sensors under mechano-luminescent (ML) light emission (MLO coupling) during cyclical strain.
Figure 11:
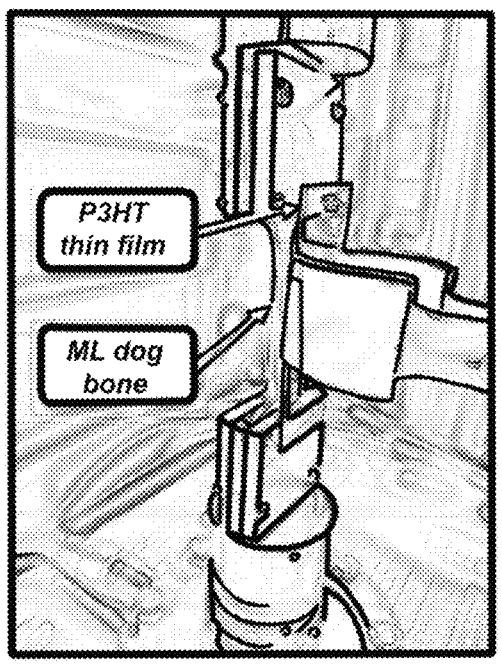
Figure 12:
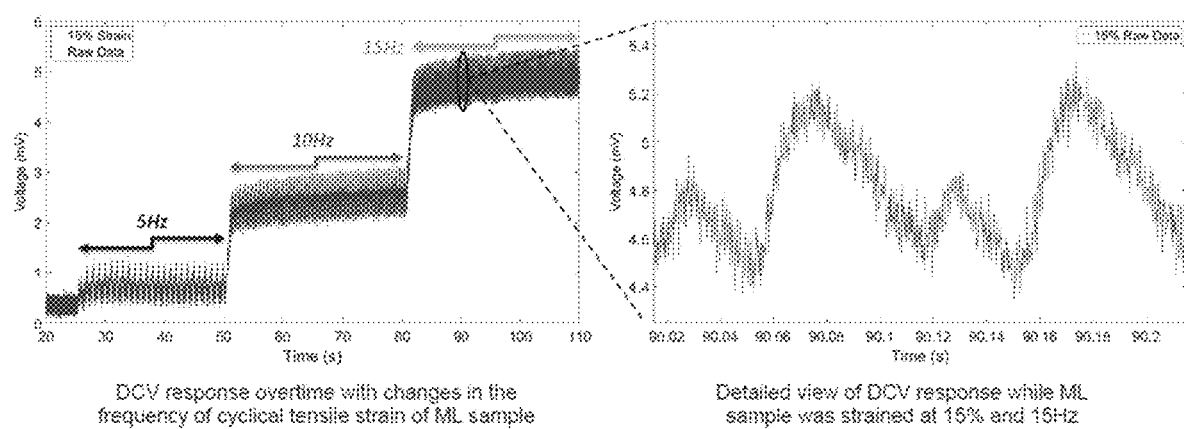
FIG. 12 shows the DCV response of a P3HT-based self-sensing thin film under ML light emission over time with changes in the frequency of cyclical tensile strain applied to the sample.

To validate MLO coupling a ML "dog bone" shaped sample was cyclically strained (15%) while going through a frequency sweep. Placed in front of the ML sample was the P3HT-based self-sensing thing film as shown in FIG. 11. Results were obtained by measuring the DC current from the P3HT-based self-sensing thing film. As can be seen in FIG. 12 the P3HT-based sensor responded directly to light emission from the ML sample and this response changed accordingly with frequency. The cyclical response of the DC voltage correlated with strain showing similar short and tall peaks. The magnitude difference seen was approximately 5 fold from 5 Hz to 15 Hz.

Figure 13:
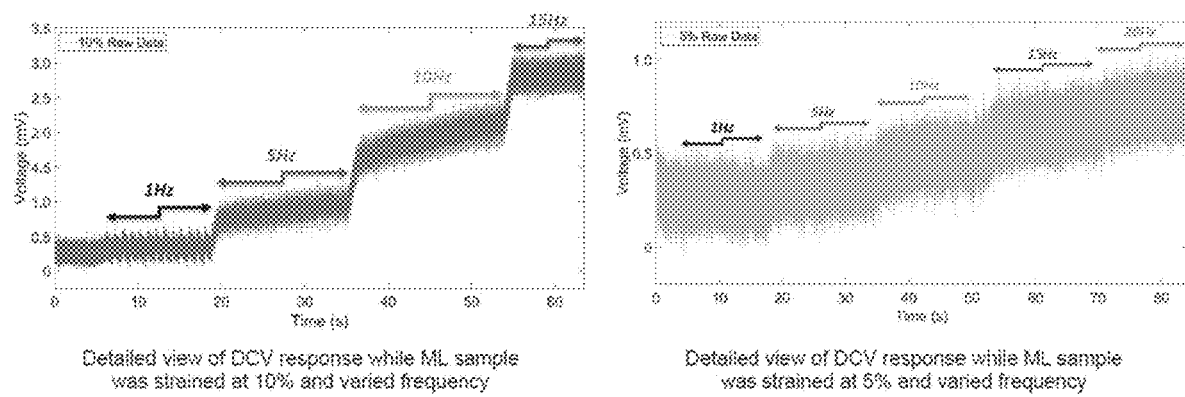
FIG. 13 shows the DCV response of a P3HT-based self-sensing thin film under ML light emission when strained at 10% (left) or 5% (right) at varying frequencies.

Similar testing of MLO coupling was also performed at 5% and 10% strain. As shown in FIG. 13 the magnitude of the measured voltage decreased with smaller strain and showed a characteristic response at all levels.

Figure 14:
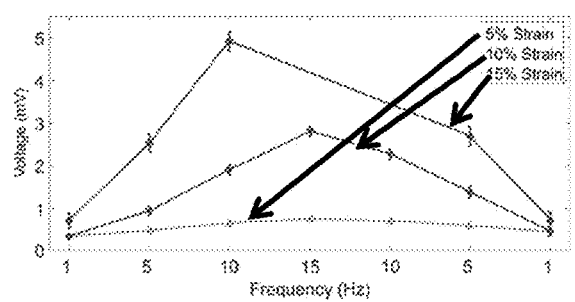
FIG. 14 (left panel) shows the mean voltage response of a P3HT-based self-sensing thin film under ML light emission for five seconds of strain cycling.
Figure 14:
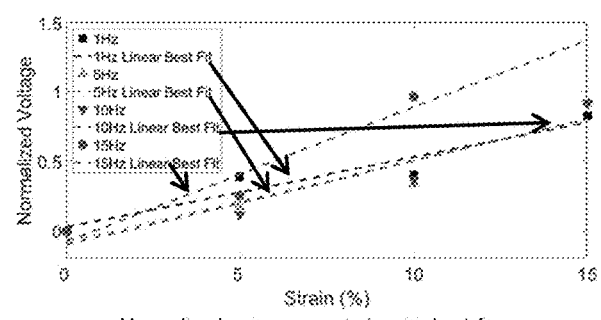

The effect on varying the maximum strain and frequency on sensitivity was determined. Results showed that the mean voltage response of MLO composites increased with greater strain and frequency, as illustrated by FIG. 14. Strain sensitivities of MLO composites were calculated by fitting linear squares line on normalized voltage. Results shown in FIG. 14 indicated that sensitivities for 1 Hz, 5 Hz, 10 Hz, and 15 Hz were 4.99, 5.87, 6.02 and 9.66 respectively.

Example 4. Design and Testing of Second Generation MLO Composites

Figure 15:
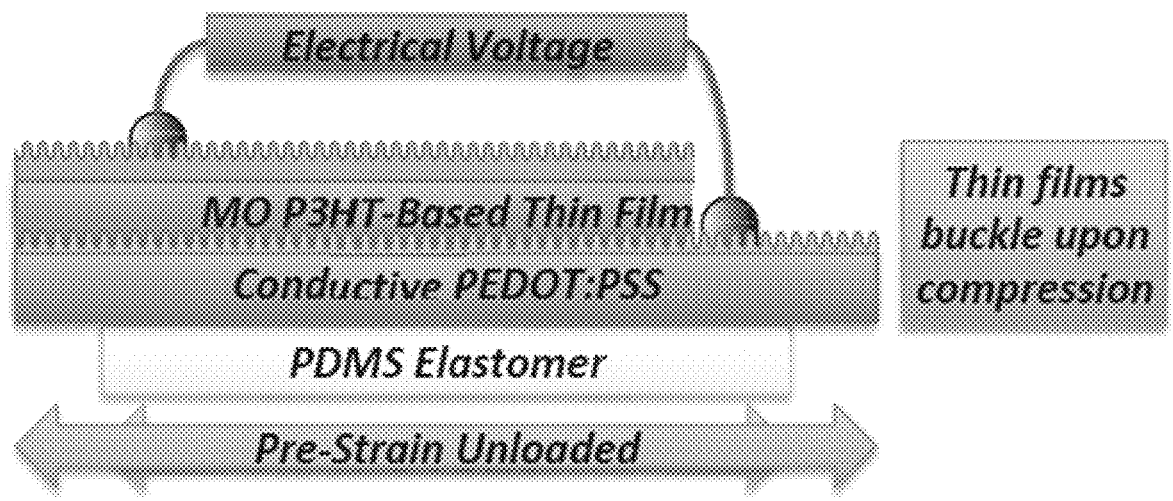
FIG. 15 shows a schematic of a self-powered sensor developed on a pre-strained polydimethylsiloxane (PDMS) elastomer matrix.
Figure 16:
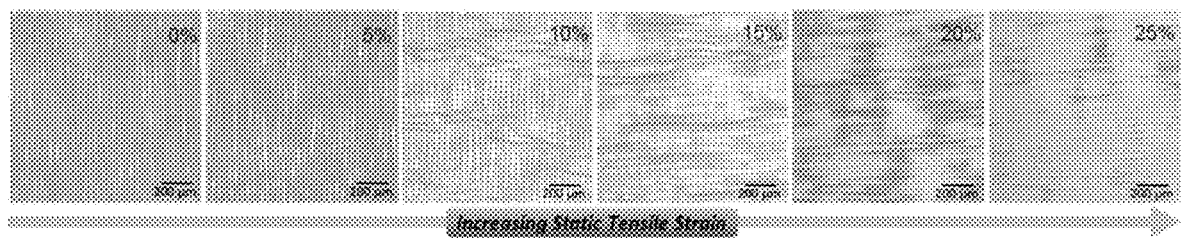
FIG. 16 shows images of 5 layer poly(3,4ethylenedioxythiophene):polystyrene sulfonate (PEDOT:PSS) pre strained at 0, 5, 10, 15, 20, or 25%.

For second generation MLO composites PEDOT:PSS was deposited on top of a PDMS elastomer that was pre-strained to about 20-25%. P3HT:PCBM thin-films were then spin coated on top of the PEDOT:PSS layer. Liquid electrode drops of eutectic gallium-indium (EGaIn) were then added to allow a connection to electrodes to be established as shown in FIG. 15. Optical images of PEDOT:PSS thin film on pre PDMS with increasing tensile strain are shown in FIG. 16. Results showed that when the pre-strained was released, the thin films buckled upon compressive forces.

Figure 17:
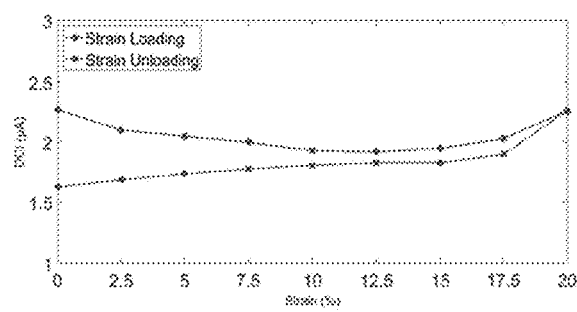
FIG. 17 shows graphs depicting direct current injection (DCI) versus strain (left) and DCV versus strain (right) of a P3HT pre-strained sample.
Figure 17:
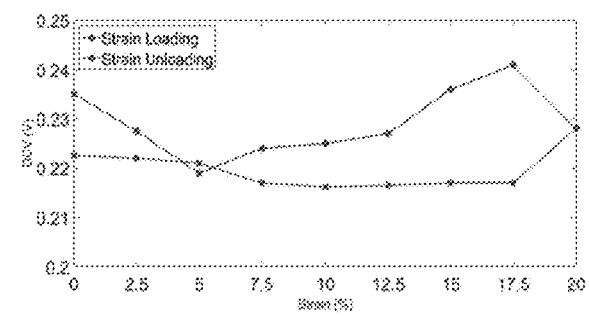

To validate the P3HT pre-strained sample response, direct current injection (DCI) and direct current voltage (DCV) was measured while tensile loading and unloading to max pre-strain values was performed. Throughout this testing a flashlight was used to illuminate the pre-strained sensors to receive a response. As shown in FIG. 17, the sensor was able to survive strain cycles and maintain electrical connection.

Figure 18:
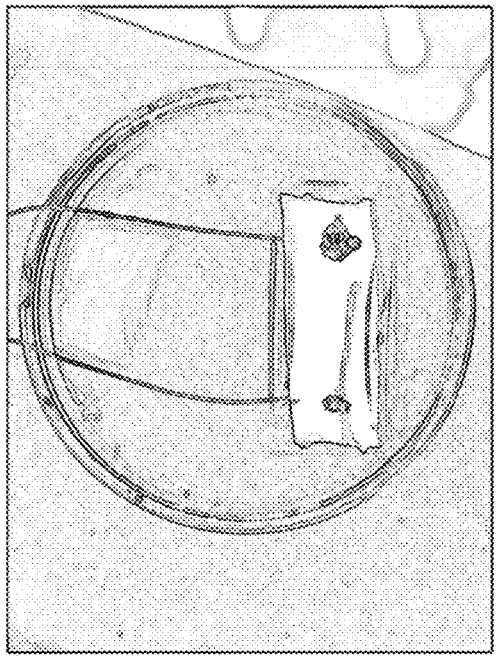
FIG. 18 shows images of flexible P3HT based sensors submerged (left) and encased (right) in PDMS.
Figure 18:
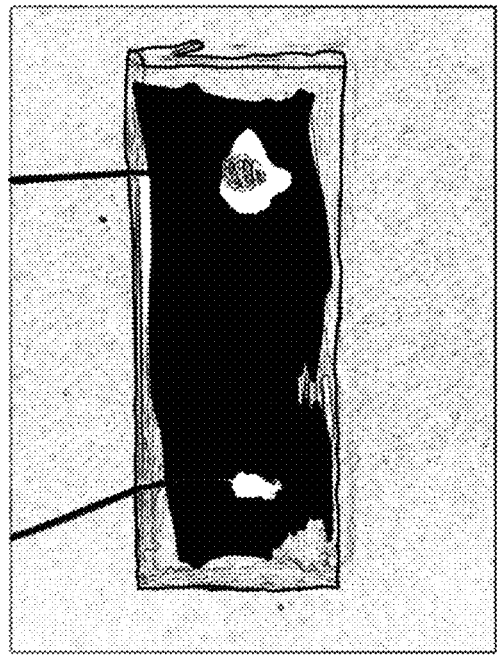

To further develop MLO composites, buckled P3HT-based thin films were encased in PDMS. This allowed a PDMS cover to protect liquid electrodes and thin film layers. To finalize fabrication, the liquid PDMS was annealed and the sensor was removed, as shown in FIG. 18.

Figure 19:
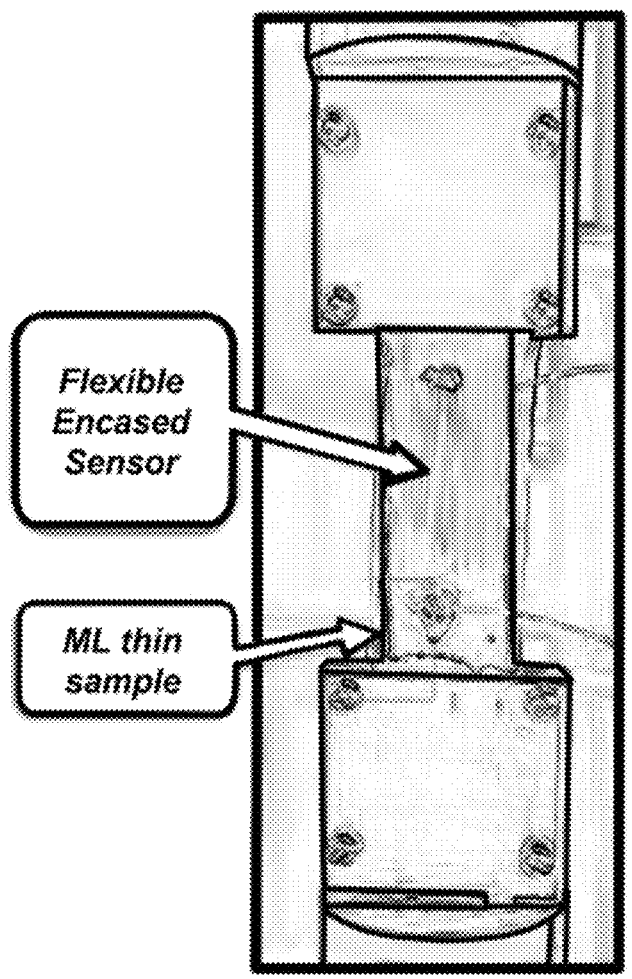
FIG. 19 shows the test set up used to validate self-powered tensile strain sensing of PDMS encased P3HT sensors.
Figure 20:
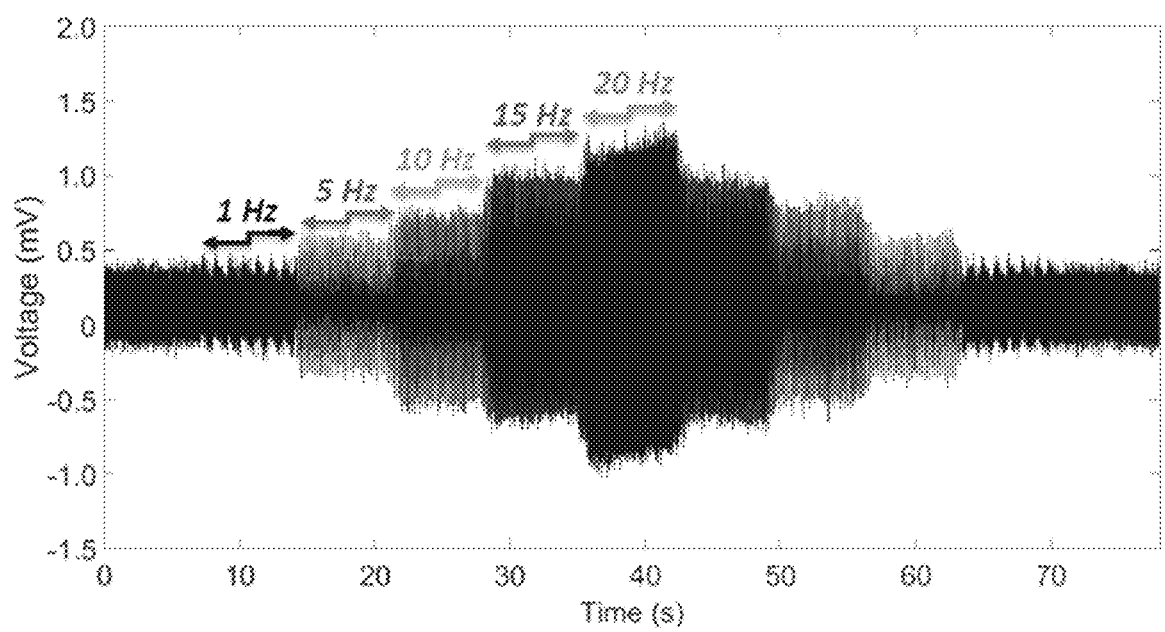
FIG. 20 shows the DCV response of a PDMS encased P3HT sensor coupled with a ML thin sample during cyclic strain at 5% at various frequencies.
Figure 21:
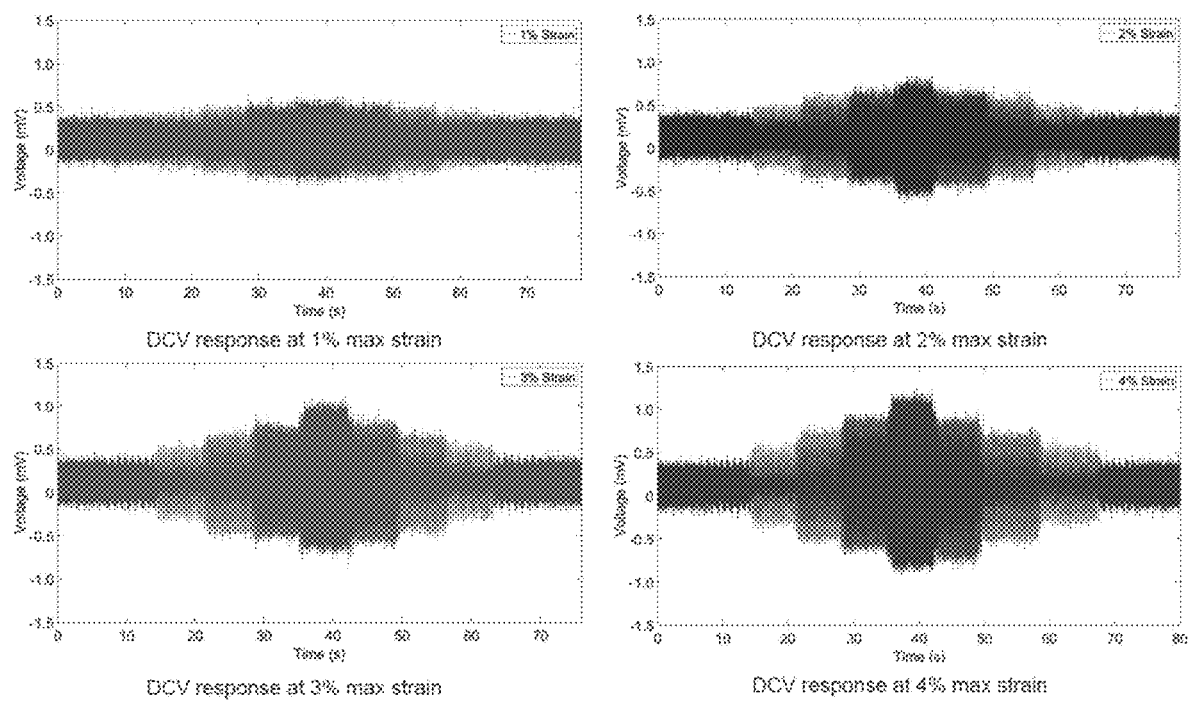
FIG. 21 shows the DCV response of PDMS encased P3HT sensor coupled with a ML thin sample at various levels of cyclic strain.
Figure 22:
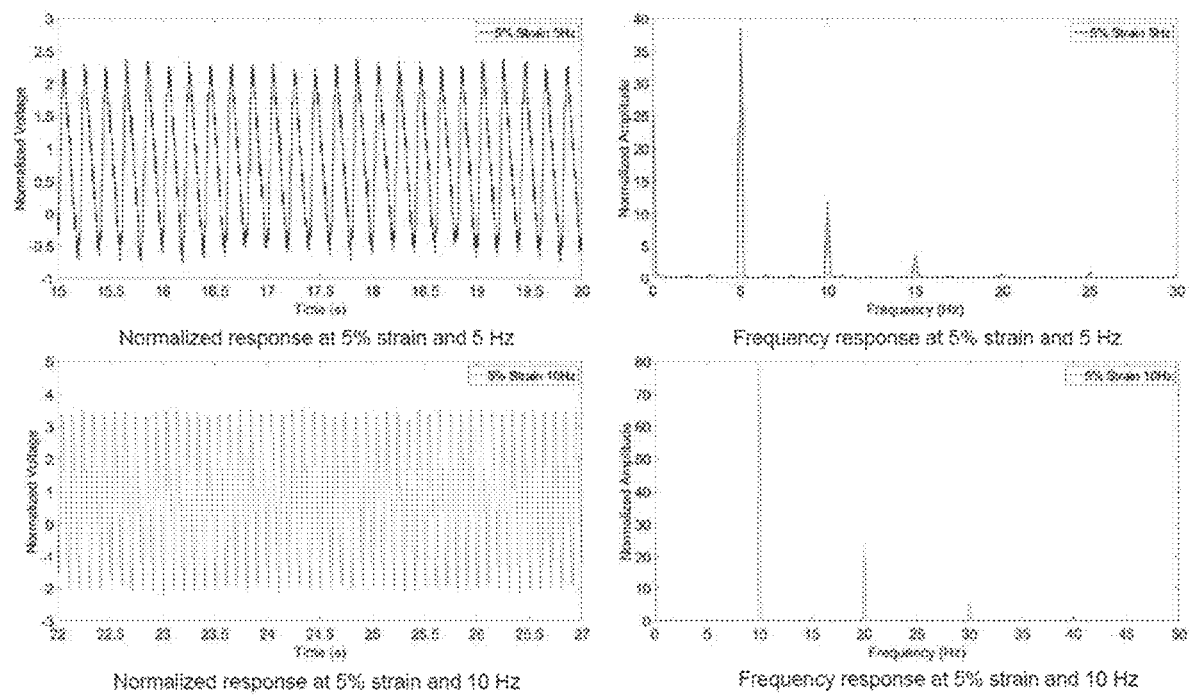
FIG. 22 shows graphs depicting the direct current generated from ML and mechano-optoelectronic (MO) coupling versus time at 5 Hz or 10 Hz frequencies (left panels), and fast Fourier transforms of graphs into the frequency domain (right panels).
Figure 23:
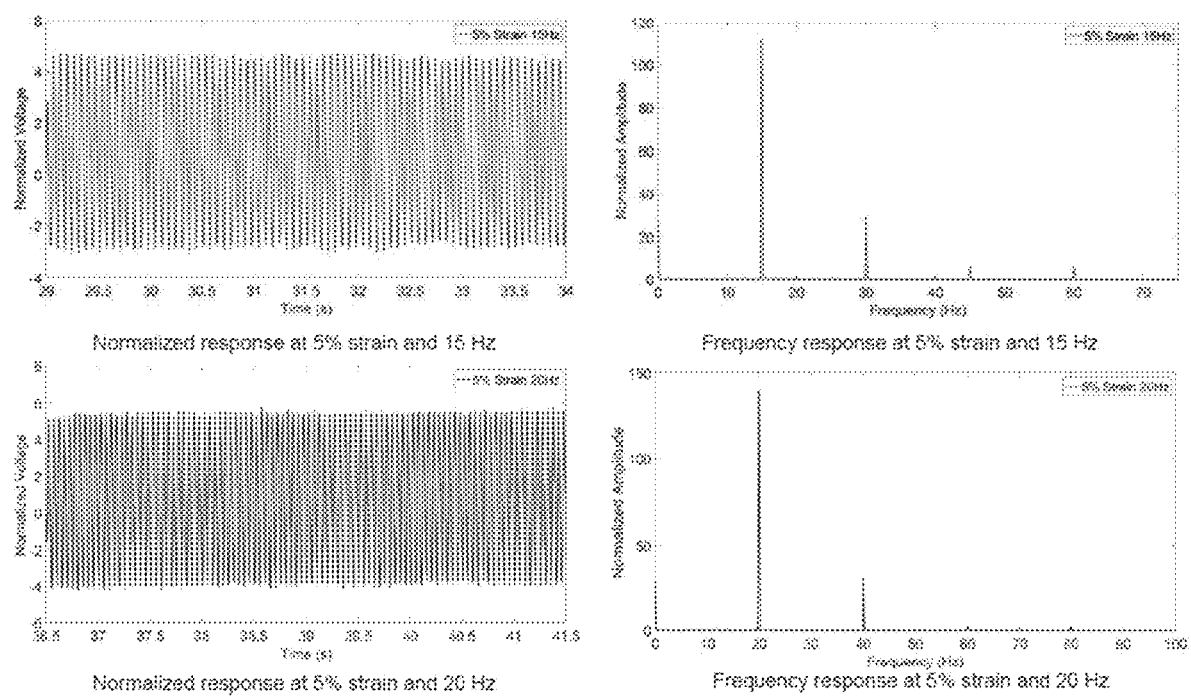
FIG. 23 shows graphs depicting the direct current generated from ML and MO coupling versus time at 15 Hz or 20

To validate self-powered tensile strain sensing of PDMS encased sensors, encased P3HT-based thin films and ML samples were mounted together on an MTS testing machine as shown in FIG. 19. Cyclic strain was then applied at maximum strain at various frequencies. The details of testing are shown below in TABLE 1. The characteristic sensor response was validated at 1%, 2%, 3%, 4%, and 5% strain, with results showing that the self-powered sensor responded directly to strain and frequency with DVC increasing with increasing frequency. These results can be seen in FIGS. 20-21. Moreover, converting time-domain normalized DC voltage response data of MLO composites to the frequency domain using fast Fourier transforms (FFT) showed that the generated DC voltage could be used to detect the frequency of the applied loading as seen in FIGS. 22-23.

TABLE 1

| Testing Step | Time range (s) | Loading Frequency (Hz) |
| --- | --- | --- |
| 1 | 0-7 | 0 |
| 2 | 7-14 | 1 |
| 3 | 14-21 | 5 |
| 4 | 21-28 | 10 |
| 5 | 28-35 | 15 |
| 6 | 35-42 | 20 |
| 7 | 42-49 | 15 |
| 8 | 49-56 | 10 |
| 9 | 56-63 | 5 |
| 10 | 63-70 | 1 |
| 11 | 70-77 | 0 |

Example 5. Assembly and Testing of PDMS-Encased MLO Composites

ML ZnS:Cu/PDMS composites and P3HT-based self-sensing thin films were prepared as described in EXAMPLE 2 and EXAMPLE 4. To obtain an MLO composite, ZnS:Cu/PDMS composites were integrated with P3HT-based self-sensing thin films by placing ZnS:Cu composites onto one side of the elastomer of the P3HT-based thin film (the side where nothing was fabricated). The integrated assembly was then encased in PDMS and annealed at 80° C. to hold the P3HT-based sensor and ZnS:Cu.PDMS composite together. A schematic and image of the assembly is shown in FIG. 24.

To validate the self-powered tensile strain sensing capabilities of PDMS-encased MLO composites, samples were mounted on an MTS load and connected to a source meter unit as shown in FIG. 25. Testing was carried out in a dark environment with a sinusoidal cyclical testing load being applied. The loading frequency was varied from 1-15 Hz with a time period of 7 s. The test steps conducted to the cyclic strain with frequency sweep for testing are shown below in TABLE 2, Voltage response was recorded by a source meter unit connected to PDMS-encased MLO composites. Results showed that voltage intensity changed with changes in loading frequency and applied strain, indicating that PDMS-encased. MILO composites are strain sensitive. Moreover, results indicated that when strain is applied light is emitted from ML ZnS:Cu composites. This light shines on MO P3HT:PCBM thin films which convert the light energy to electrical energy. Source meter measurements showed that the voltage intensity increased with increasing amounts of produced light. No voltage response was seen for strains of <5%. A summary of these results can be seen in FIGS. 26-28.

TABLE 2

| Testing Step | Time range (s) | Loading Frequency (Hz) |
| --- | --- | --- |
| 1 | 0-7 | 1 |
| 2 | 7-14 | 5 |
| 3 | 14-28 | 10 |
| 4 | 21-28 | 15 |

Example 6. Assembly and Validation of AutoCom Components

AutoCom components are assembled by integrating MLO composites described in EXAMPLE 5 with FRPs. MLO composites that are 3.5 mm thick are placed between two FRP strips that each have a thickness of 1.5 mm. Epoxy resin is used to hold the AutoCom components together. An image and schematic of AutoCom components can be seen in FIG. 29. Tested AutoCom samples were 177.8 mm in length.

To validate the self-sensing capability of AutoCom assemblies, a four point bending test-setup was used. AutoCom samples were loaded on a load frame and connected to a source meter unit. Point loads were applied at four locations; two on the top, and two on the bottom of the sample. Cyclic load was applied from the two point loads on the top of the sample while the sample was displaced from its neutral position in the downward direction. The source meter unit was used to record the self-powered capability of AutoCom samples. An example of the testing setup and the displacement load pattern used for testing can be seen in FIG. 30.

FIG. 31-32 shows voltage response recorded from tests with AutoCom samples. Loading frequencies of 900 mm/min and 1500 mm/min were tested. Tests showed that when strain was applied to AutoCom samples, light was emitted from ZnS:Cu composites and absorbed by MO P3HT:PCBM thin films. Light is then converted to electrical energy which was recorded by the source meter unit. As seen in FIG. 33, voltage intensity increased with increases in loading frequency and strain.

Example 7. Validation Tests of MLO Multifunctional Composites

Validation tests of MLO multifunctional composites are conducted by subjecting the fabricated MLO multifunctional composites to fatigue loading tests. The MLO composites generate DC which varies with applied strain. Ground vibration tests (GVTs), which model the forces felt by an aircraft during use, are conducted on the fabricated AutoComs with embedded MLO multifunctional composites. The power conversion efficiency (PCE) of the AutoComs is assessed using GVTs based on acquired current-voltage (IV) responses. The robustness and resiliency of the AutoComs and MLO multifunctional components are assessed under various environmental and operating conditions.

Example 8. Encoding Multifunctional Capabilities into an AutoCom

AutoComs are fabricated by laminating the designed MLO multifunctional composites between fiber membranes while vacuum bagging the FRP composites. The AutoComs are subjected to various types of fatigue loadings to validate autonomous delamination detection using a vibration-based SHM framework. The application of the vibration-based SHM for delamination detection is expanded using a sub-structuring technique, which diminishes the computational cost of dynamic analysis of structures.

Example 9. Validation of the Autonomous Damage Detection and Energy Harvest of the AutoComs Aerostructures test wings (ATWs), which are used as a model of an aircraft wing, are fabricated using the developed AutoComs. At a flight loads lab (FLL), the AutoCom ATWs are subjected to various ground tests (e.g., structural deflection measurements, thermal testing, etc.) to validate the ability of the Autocoms to detect delamination and harvest energy. The experiment at FLL induces artificial delamination in the ATWs to simulate delamination damage of the AutoCom ATWs. The 3-dimensional and multi-modal delamination detection capabilities of the ATW are validated.

DC generated from the AutoCom ATWs resulting from GVT vibrational loads is measured using an electric data acquisition system composed of a digital multimeter and a source-measurement unit. The time-domain DC sensor data is converted to frequency-domain data to detect modal frequency shifts and mode shape changes, which could indicate the onset of FRP interior delamination. Delamination damage at various depths in the out-of-plane direction of the FRP composites is detected using 3-dimensional damage technology. The aerodynamic characteristics of the AutoCom ATWs are analyzed to predict the ATW's behavior as a part of UASs and reusable aerospace structures.

Example 10. Viability of AutoComs

The effect of the space environment on constitutive elements of AutoComs is considered, and the performance of AutoComs is validated using an active SHM technology known as the electro-mechanical impedance method. The utility of the electro-mechanical impedance method has been demonstrated during suborbital space flight tests. The electro-mechanical impedance method is used to study the dynamic response of AutoComs in the mid- and high-frequency ranges. The application of electro-mechanical impedance SHM to composite structures is examined. The delamination detection capability of the AutoComs is validated using a vibration-based SHM methodology. Vibration-based SHMs enhanced by sub-structure techniques and failure reliability analyses are used to estimate the remaining service lives (i.e., prognosis) of the structural systems. The fabrication technologies used to manufacture the AutoComs are used for the advance manufacturing of the multifunctional composites.

What is claimed is:
1. A structure comprising:
   a) a first layer, wherein the first layer is a first fiber-reinforced polymer,
   b) a second layer, wherein the second layer is a second fiber-reinforced polymer, and
   c) a mechano-luminescence-optoelectronic composite layer,
   wherein:
   i) the mechano-luminescence-optoelectronic composite layer is layered between the first layer and the second layer, and is connected to the first layer and the second layer; and
   ii) the mechano-luminescence-optoelectronic composite produces a direct current in response to a mechanical force that is exerted on the structure.
2. The structure of claim 1, wherein the structure is a portion of an aerospace structure.
3. The structure of claim 1, wherein the structure is a portion of a spacecraft.
4. The structure of claim 1, wherein the structure is a portion of an unmanned aircraft.
5. The structure of claim 1, wherein the mechano-luminescence-optoelectronic composite comprises:

a) a conductive sheet, wherein the conductive sheet comprises a first face and a second face;
b) a mechano-luminescent elastomeric substrate disposed to the first face of the conductive sheet; and
c) a mechano-optoelectronic film disposed to the second face of the conductive sheet.

6. The structure of claim 5, wherein the mechano-luminescent elastomeric substrate is a ZnS:Cu/polydimethylsiloxane composite.

7. The structure of claim 6, wherein the ZnS:Cu/polydimethylsiloxane composite contains about 5% to about 70% ZnS:Cu by mass.

8. The structure of claim 5, wherein the conductive sheet is a poly(3,4-ethylenedioxythiophene) :polystyrene sulfonate sheet.

9. The structure of claim 5, wherein the mechano-optoelectronic film is a poly(3-hexylthiophene) film.

10. The structure of claim 5, wherein the mechano-optoelectronic film is a poly(3-hexylthiophene): phenyl-C61-butyric acid methyl ester film.

11. The structure of claim 9, wherein the poly(3-hexylthiophene) film is doped with carbon nanotubes.

12. The structure of claim 10, wherein the poly(3-hexylthiophene):phenyl-C61-butyric acid methyl ester film comprises a 1:1 weight ratio of poly(3-hexylthiophene) to phenyl-C61-butyric acid methyl ester.

13. The structure of claim 1, wherein the first layer has a thickness that is about 0.1 mm to about 5 mm, and the second layer has a thickness that is about 0.1 mm to about 5 mm.

14. The structure of claim 1, wherein the first layer has a thickness that is about 1.5 mm, and the second layer has a thickness that is about 1.5 mm.

15. The structure of claim 1, wherein the mechano-luminescence-optoelectronic composite has a thickness that is about 0.1 mm to about 5 mm.

16. The structure of claim 1, wherein the mechano-luminescence-optoelectronic composite has a thickness that is about 3.5 mm.

17. The structure of claim 1, wherein the mechanical force is a vibrational force.

18. A structure comprising:
a) a first layer, wherein the first layer is a first fiber-reinforced polymer,
b) a second layer, wherein the second layer is a second fiber-reinforced polymer, and
c) a mechano-luminescence-optoelectronic composite layer,
wherein:
i) the mechano-luminescence-optoelectronic composite layer is layered between the first layer and the second layer, and is connected to the first layer and the second layer,
ii) the mechano-luminescence-optoelectronic composite produces a direct current in response to a mechanical force that is exerted on the structure; and
iii) the mechano-luminescence-optoelectronic composite comprises:
1) a poly(3,4-ethylenedioxythiophene):polystyrene sulfonate sheet, wherein the poly(3,4-ethylenedioxythiophene):polystyrene sulfonate sheet comprises a first face and a second face;
2) a ZnS:Cu/polydimethylsiloxane composite that contains about 70% ZnS:Cu by weight and is disposed to the first face of the poly(3,4-ethylenedioxythiophene) :polystyrene sulfonate sheet; and
3) a poly(3-hexylthiophene):phenyl-C61-butyric acid methyl ester film disposed to the second face of the poly(3,4-ethylenedioxythiophene) polystyrene sulfonate sheet,
wherein the structure is a portion of an unmanned aircraft.

* * * * *